United States Patent
Kinoshita

(10) Patent No.: US 7,812,406 B2
(45) Date of Patent: Oct. 12, 2010

(54) SEMICONDUCTOR DEVICE, METHOD FOR MANUFACTURING SEMICONDUCTOR DEVICE, AND METHOD FOR MANUFACTURING SEMICONDUCTOR MEMORY DEVICE

(75) Inventor: Hideyuki Kinoshita, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/251,990

(22) Filed: Oct. 15, 2008

(65) Prior Publication Data
US 2009/0096035 A1 Apr. 16, 2009

(30) Foreign Application Priority Data
Oct. 16, 2007 (JP) ............... 2007-269391

(51) Int. Cl.
*H01L 21/8234* (2006.01)
(52) U.S. Cl. .............. 257/390; 438/183; 438/926
(58) Field of Classification Search ........... 438/183, 438/926
See application file for complete search history.

(56) References Cited

U.S. PATENT DOCUMENTS 6,555,427 B1 * 4/2003 Shimizu et al. ........... 438/238
6,661,052 B2 * 12/2003 Matsui et al. ............. 257/316

FOREIGN PATENT DOCUMENTS

JP 2003-243617 8/2003
JP 2004-349622 12/2004

* cited by examiner

*Primary Examiner*—Bradley K Smith
*Assistant Examiner*—Mohammad Choudhry
(74) *Attorney, Agent, or Firm*—Finnegan, Henderson, Farabow, Garrett & Dunner, L.L.P.

(57) ABSTRACT

A method for manufacturing a semiconductor device has forming a first insulating film on a semiconductor substrate, forming an electrode layer on said first insulating film, etching said electrode layer, said first insulating film and said semiconductor substrate of a first predetermined region to form a trench, burying an element-isolating insulating film in said trench, forming a second insulating film on said element-isolating insulating film and above said electrode layer, etching said second insulating film, said electrode layer and said element-isolating insulating film of a second predetermined region to form a gate pattern and a dummy pattern, forming a third insulating film for covering said gate pattern and said dummy pattern, and planarizing said third insulating film using said second insulating film as a stopper.

16 Claims, 52 Drawing Sheets

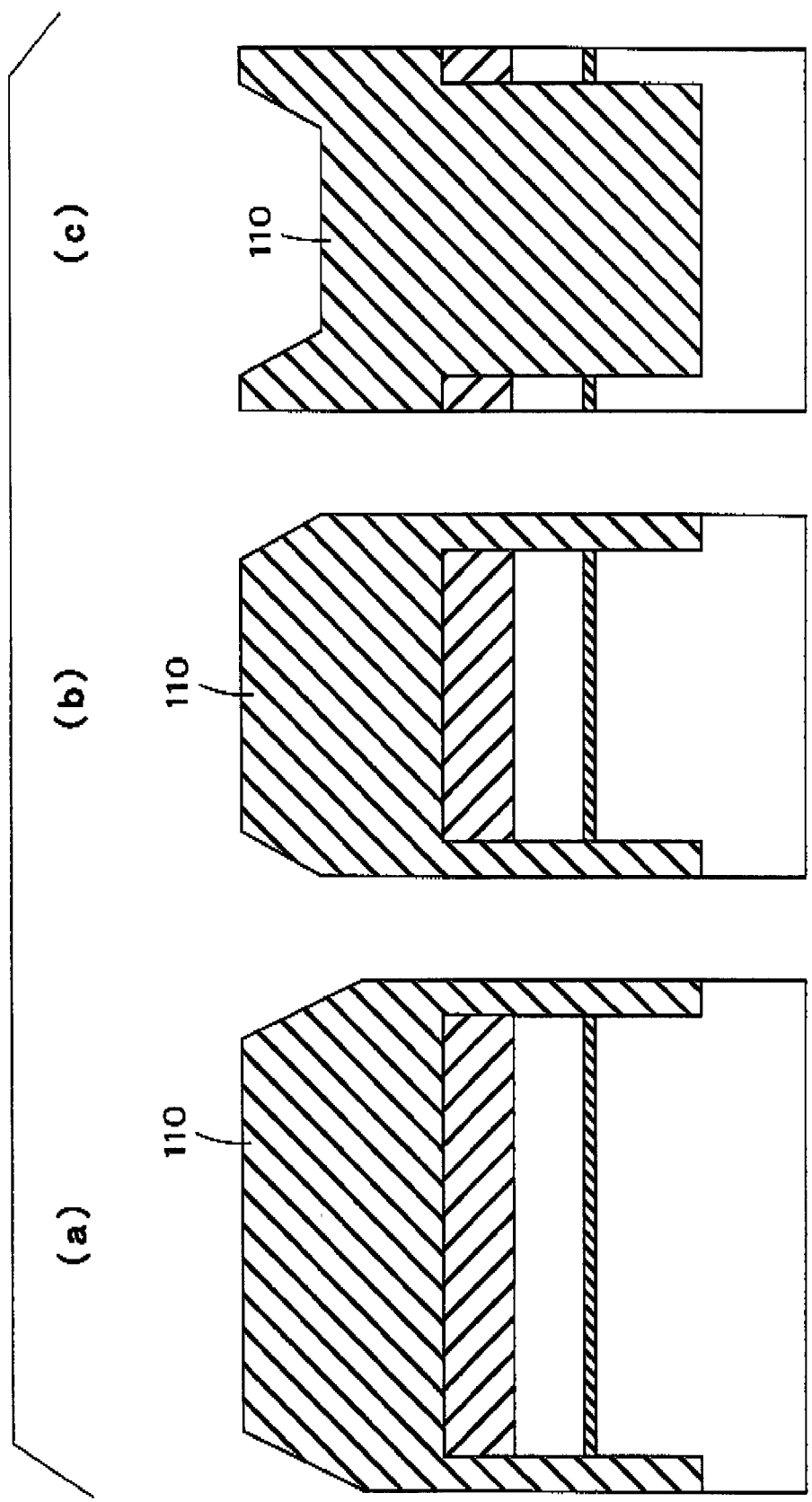
F I G. 5

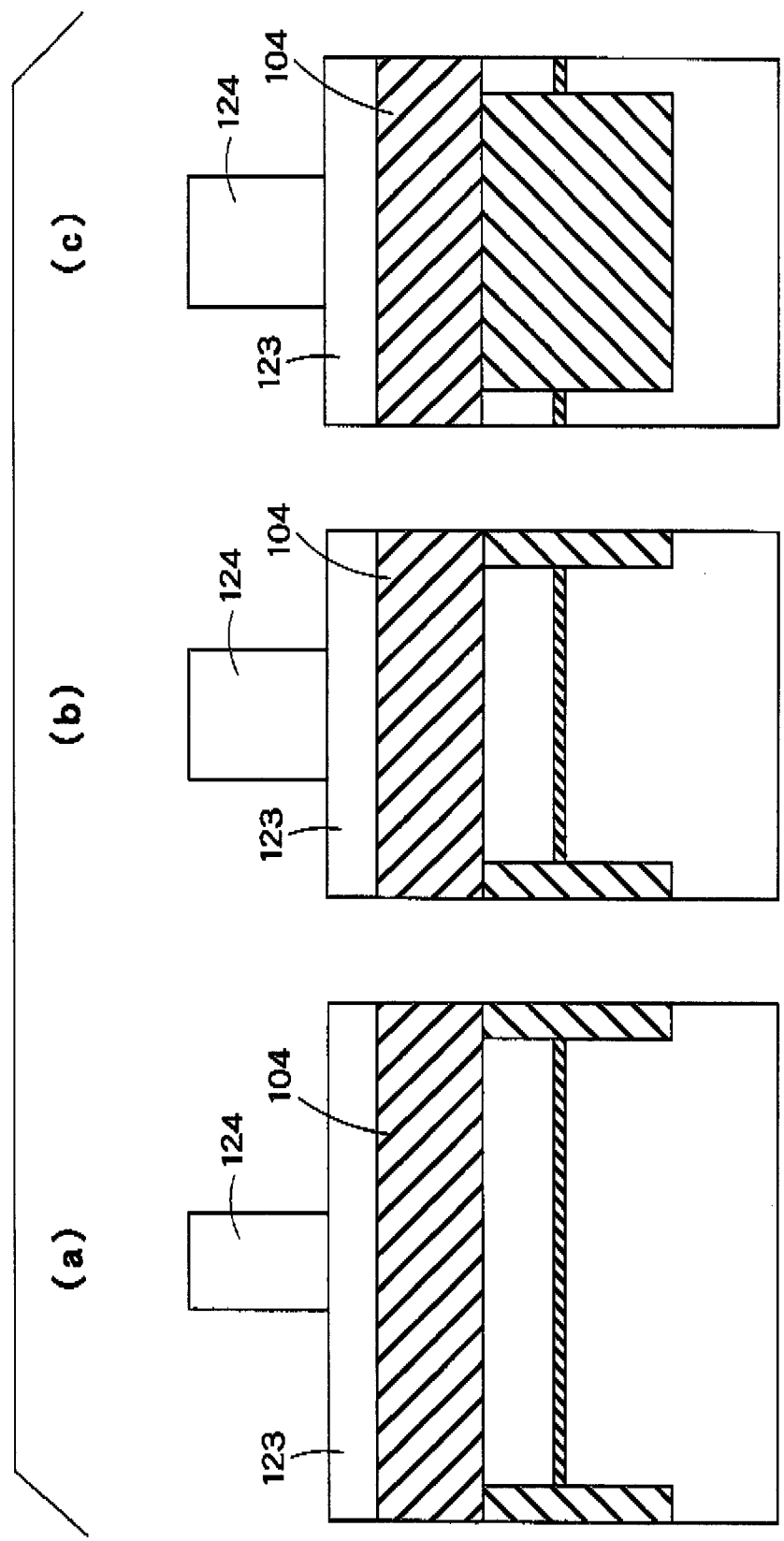
F I G. 10

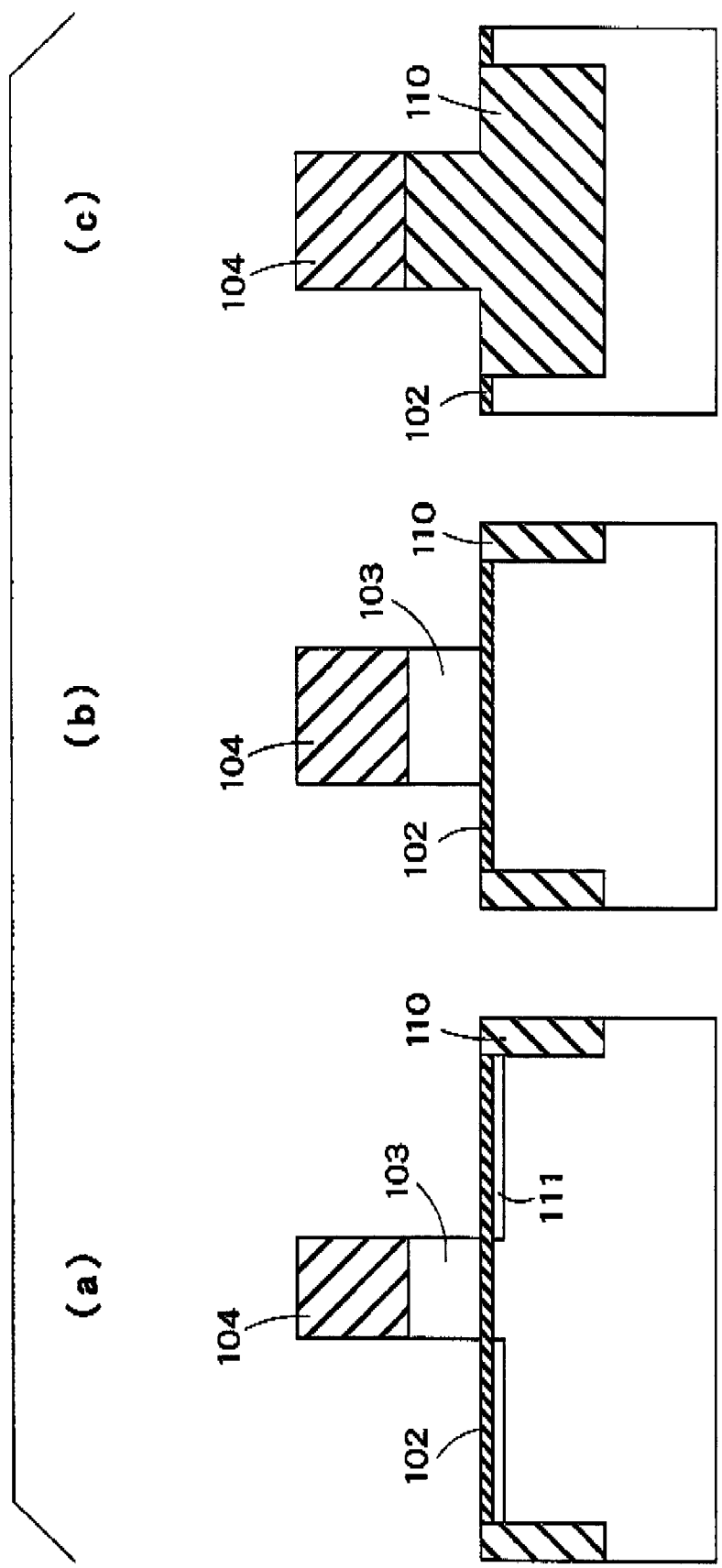
F I G. 11

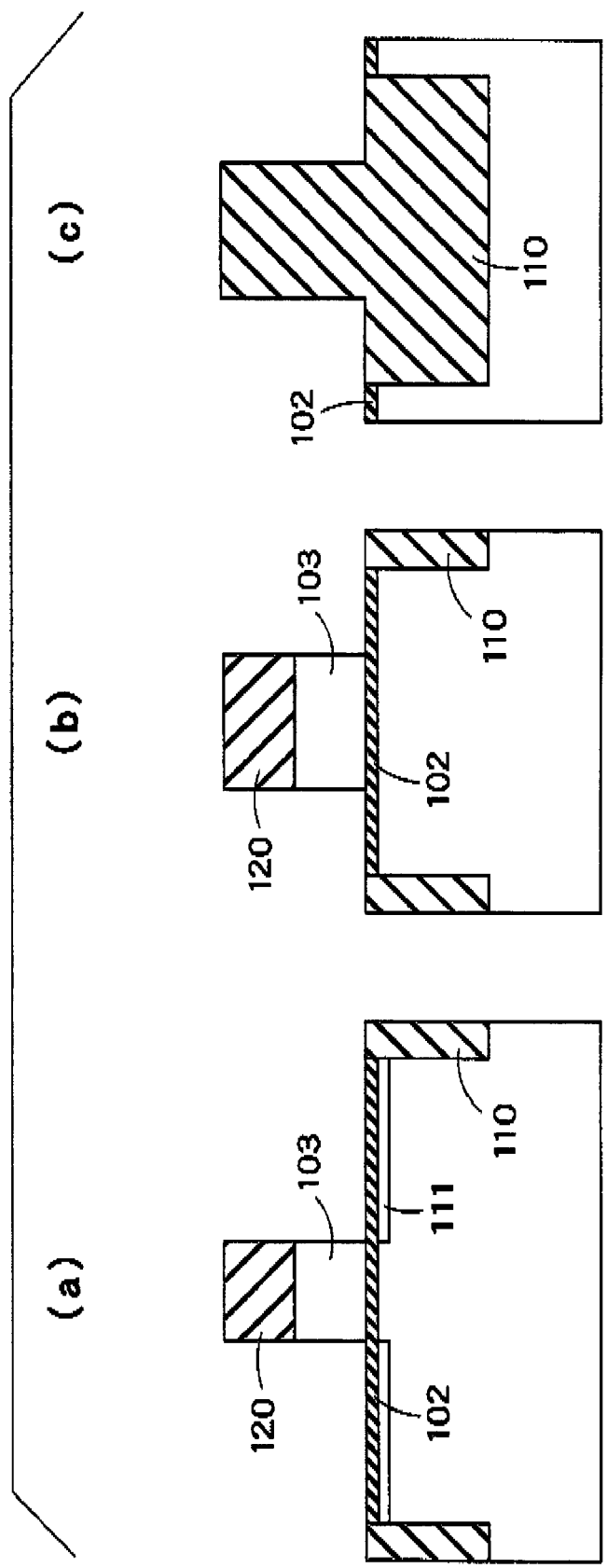
F I G. 17

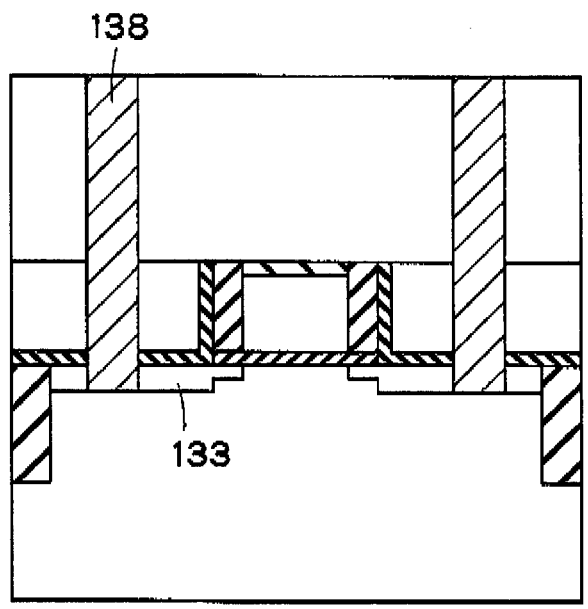
F I G. 22A
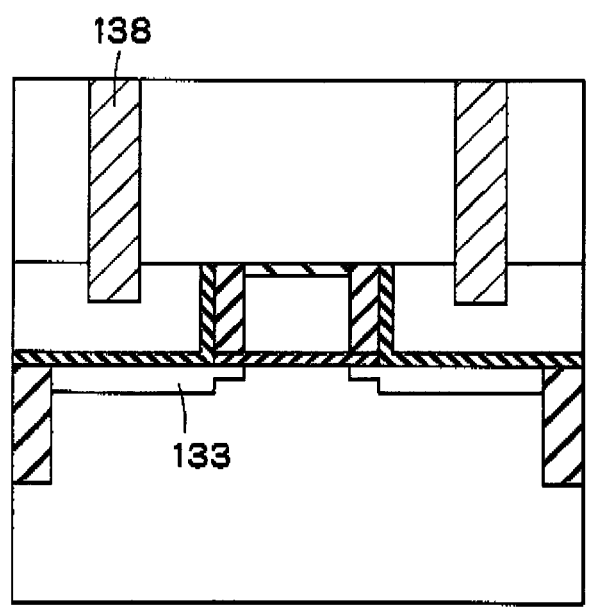
F I G. 22B

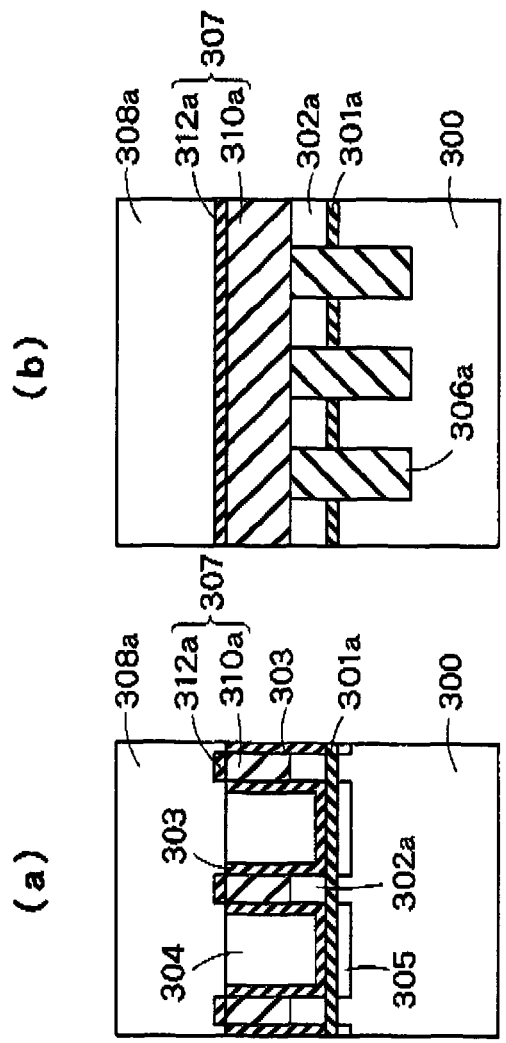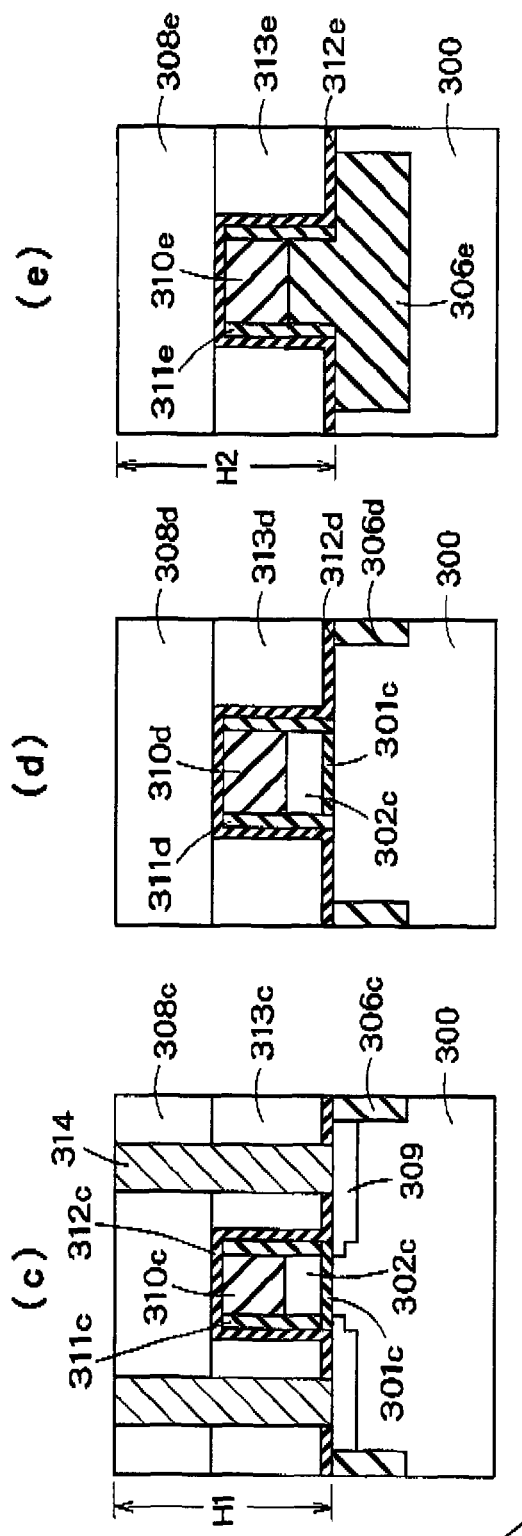
FIG. 33

FIG. 34
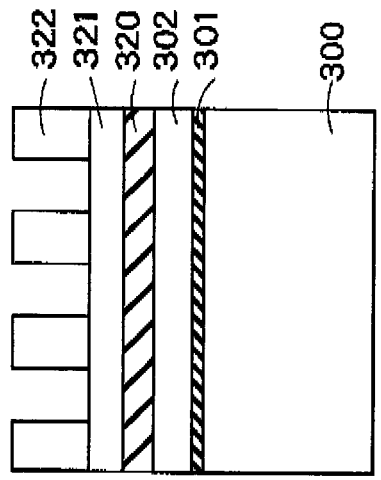
(a)
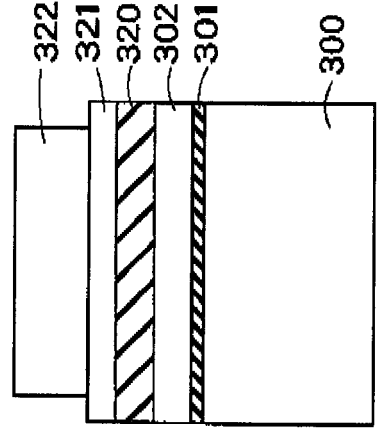
(b)
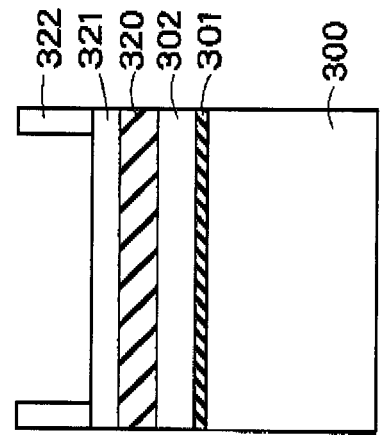
(e)
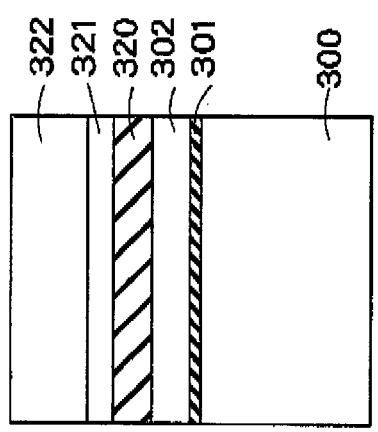
(c)
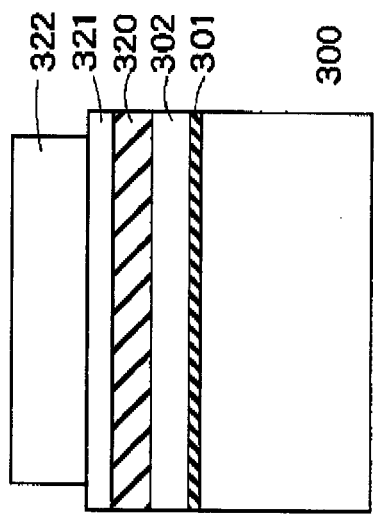
(d)

FIG. 35
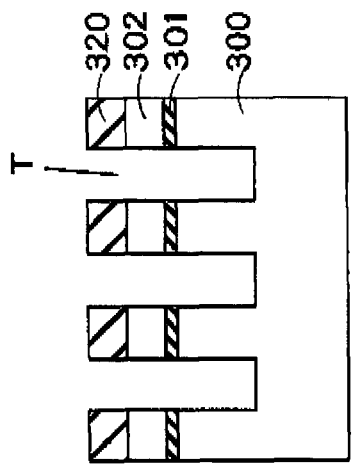
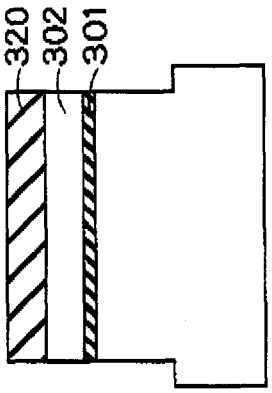
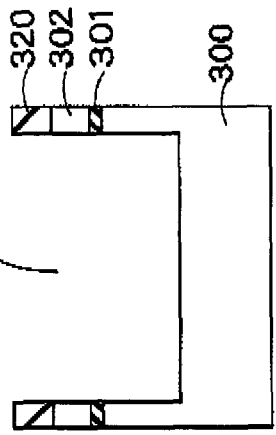
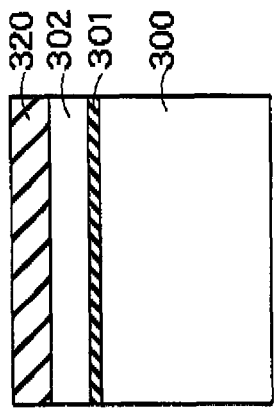
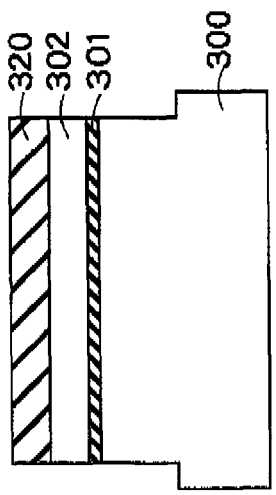

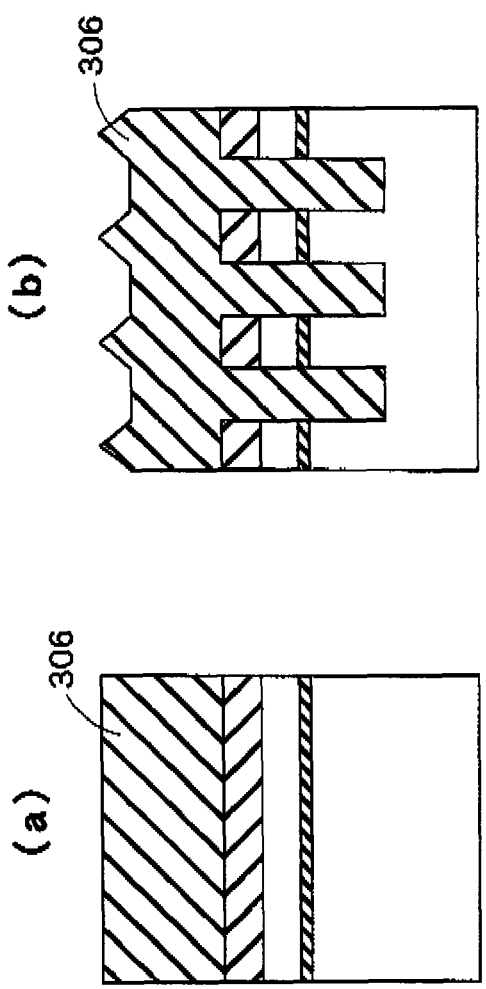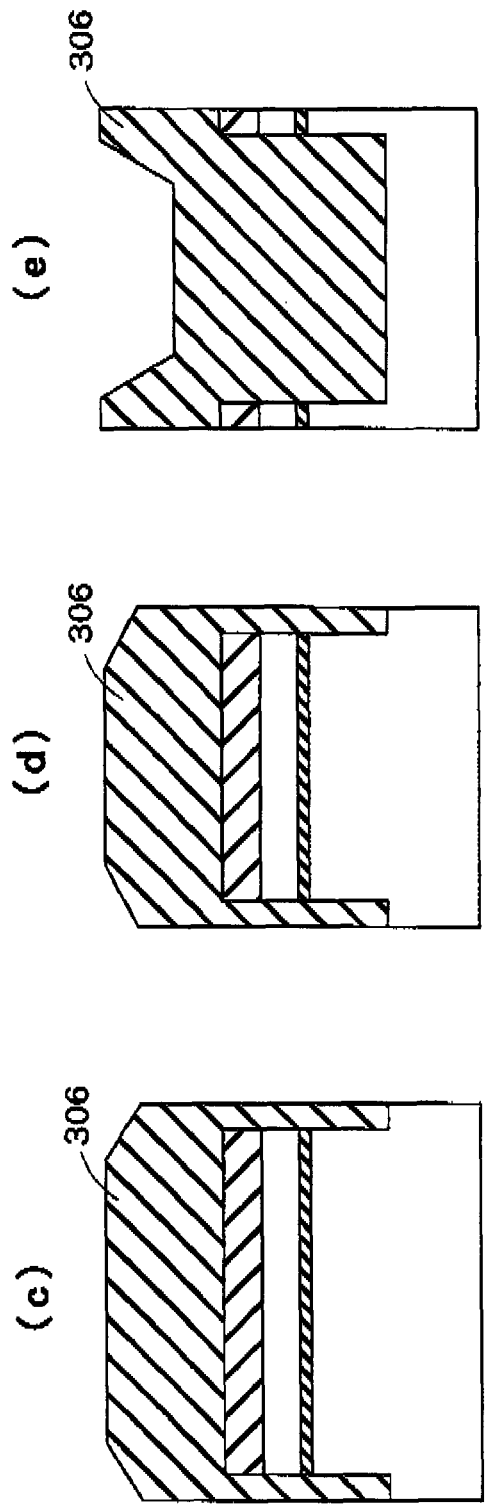
FIG. 36

FIG. 37
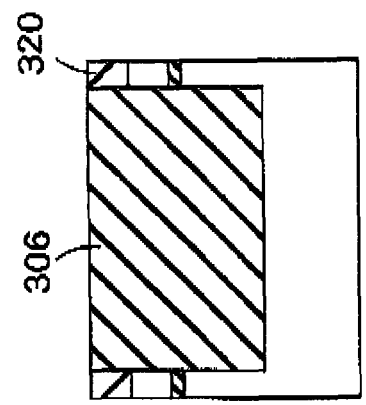
(e)
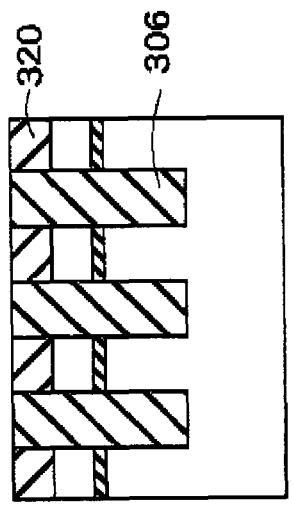
(b)
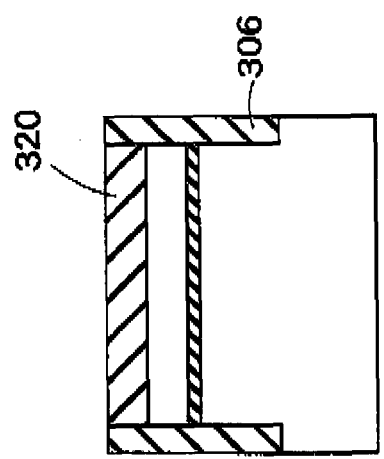
(d)
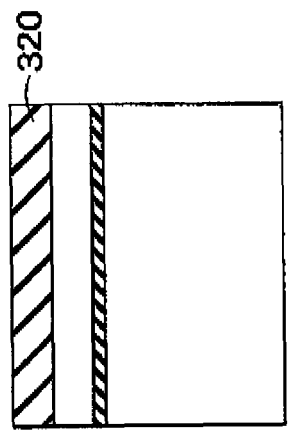
(a)
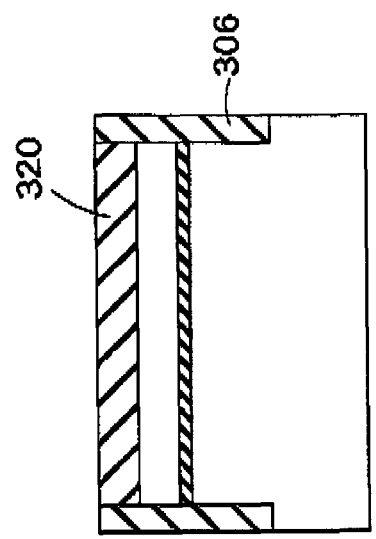
(c)

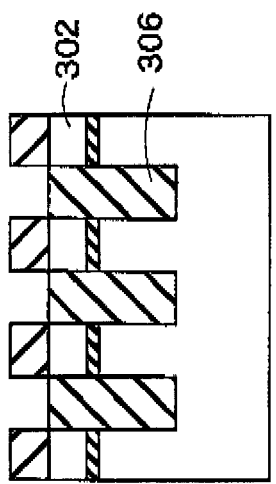
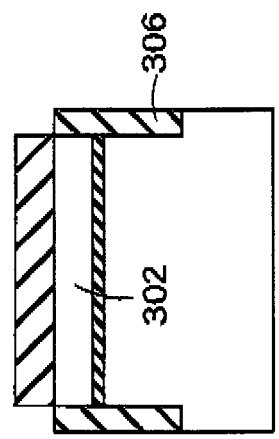
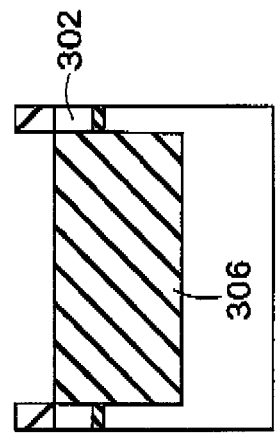
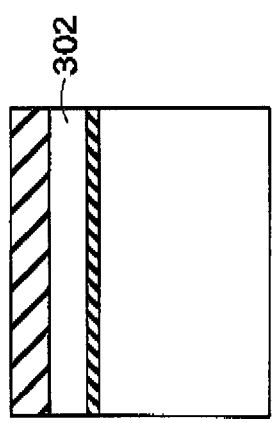
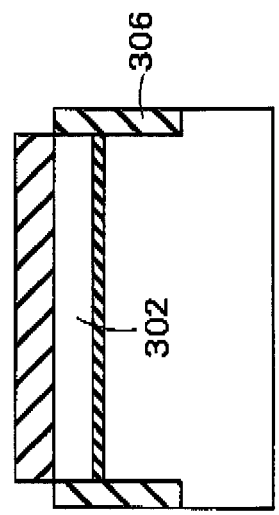
FIG. 38

F I G. 39
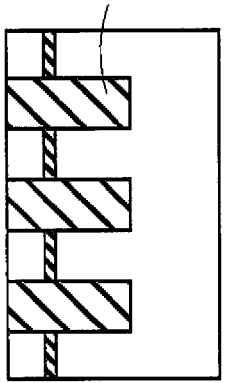
(b)
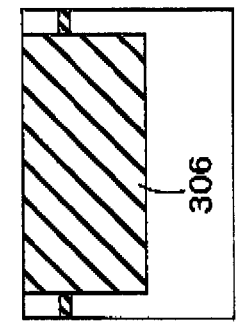
(e)
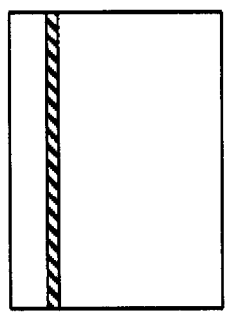
(a)
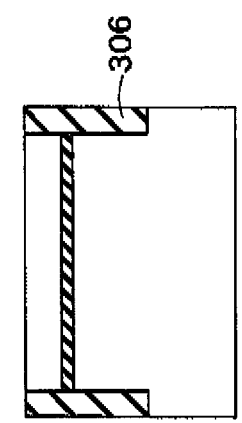
(d)
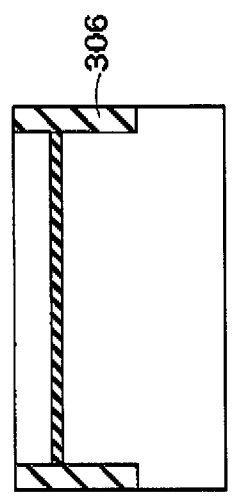
(c)

FIG. 40
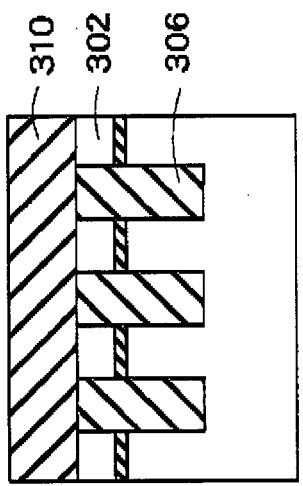
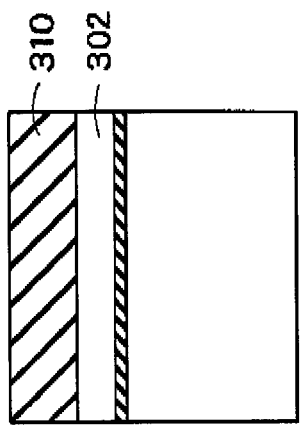
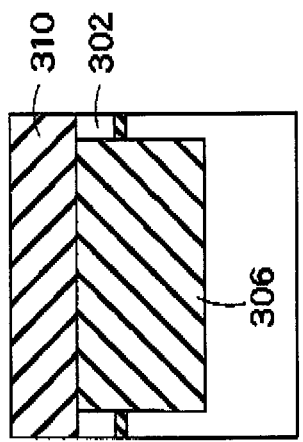
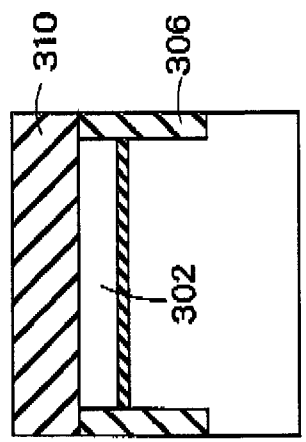
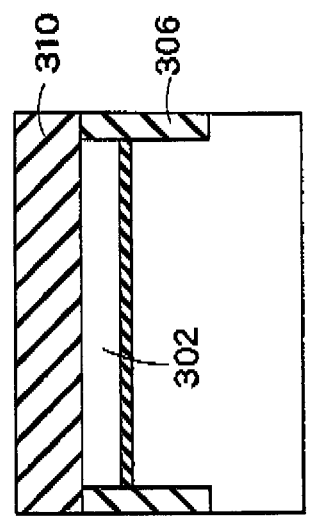

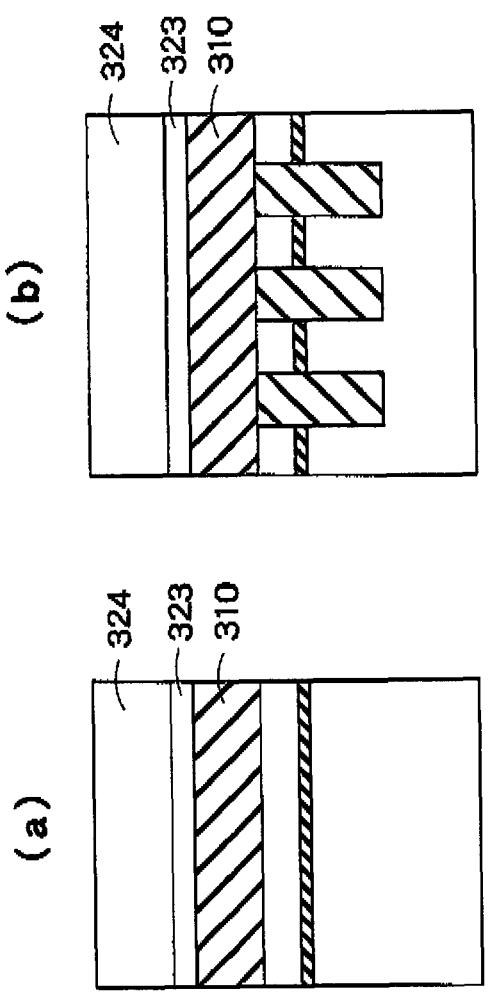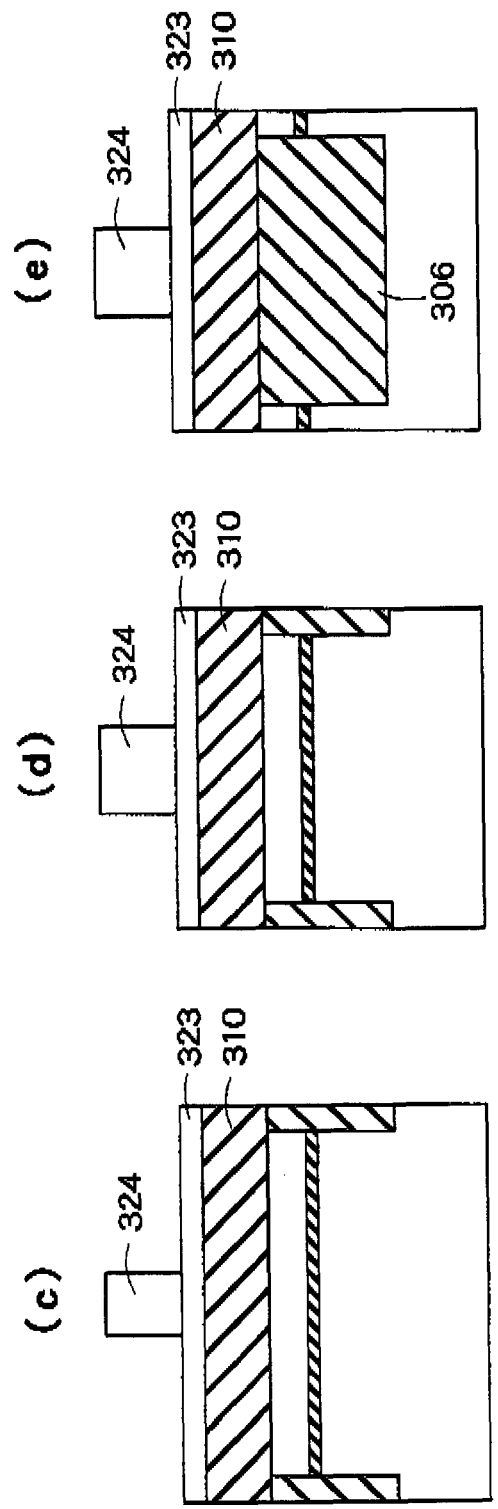
FIG. 41

FIG. 42
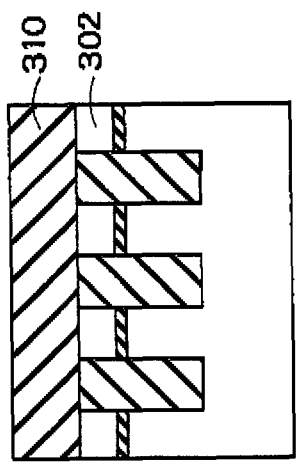
(b)
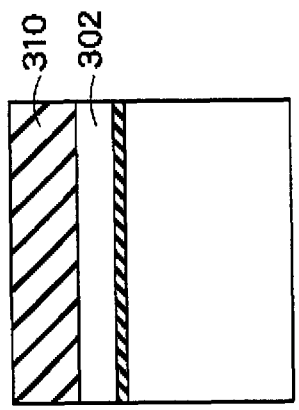
(a)
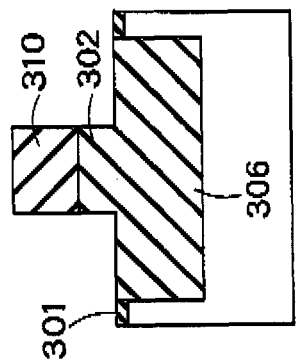
(e)
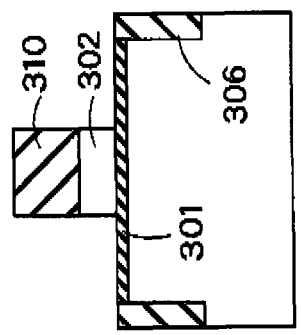
(d)
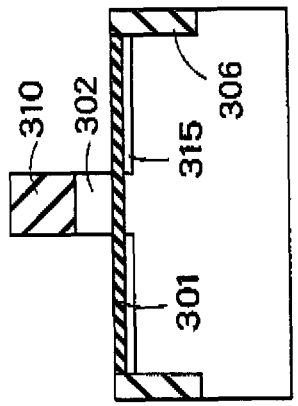
(c)

F I G. 44
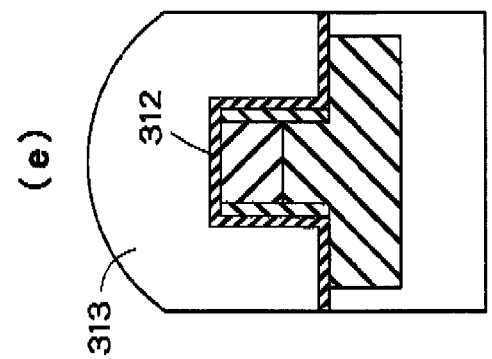
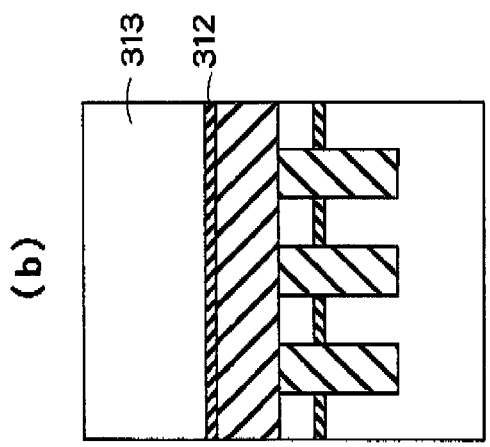
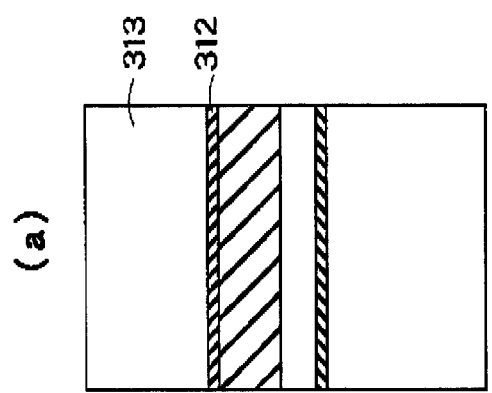
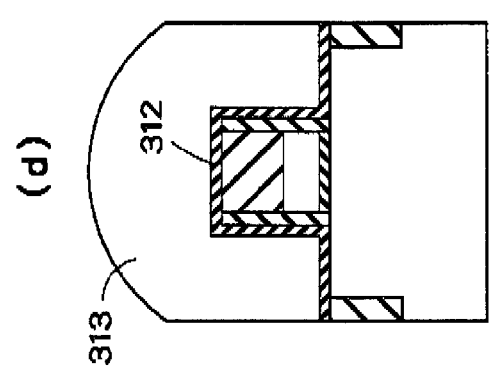
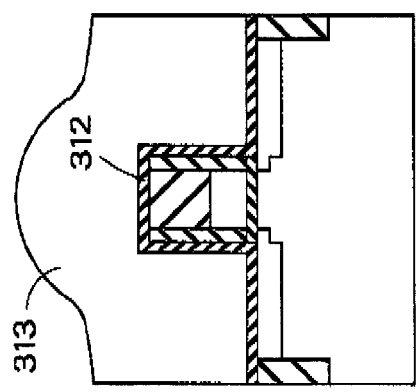

F I G. 45
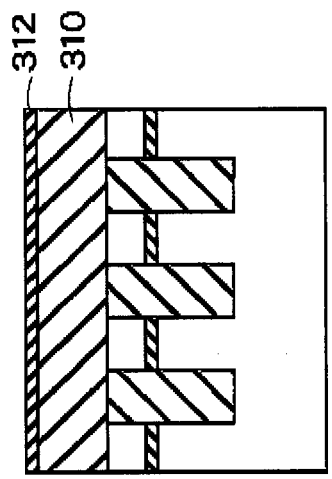
(a)
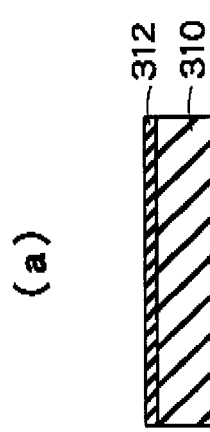
(b)
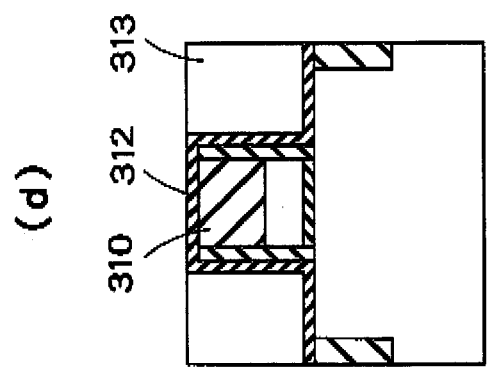
(c)
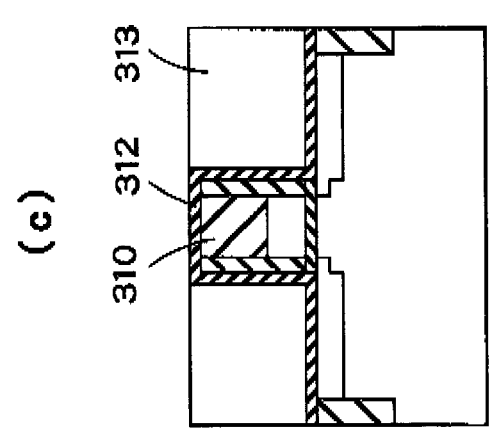
(d)
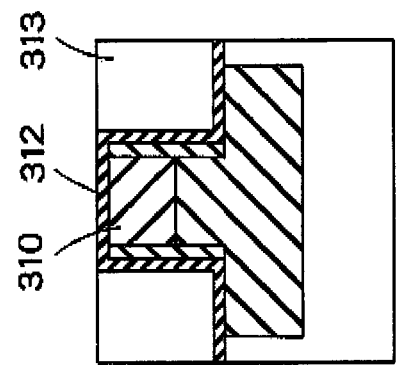
(e)

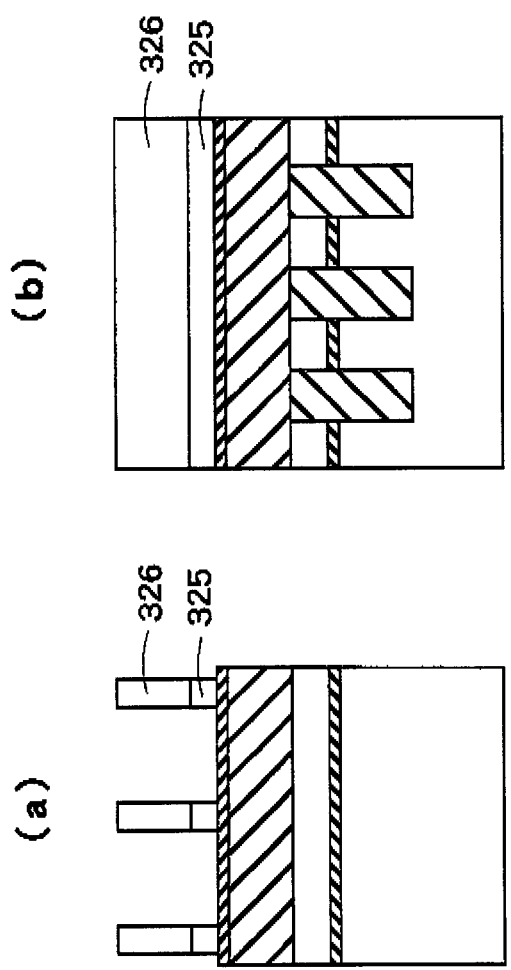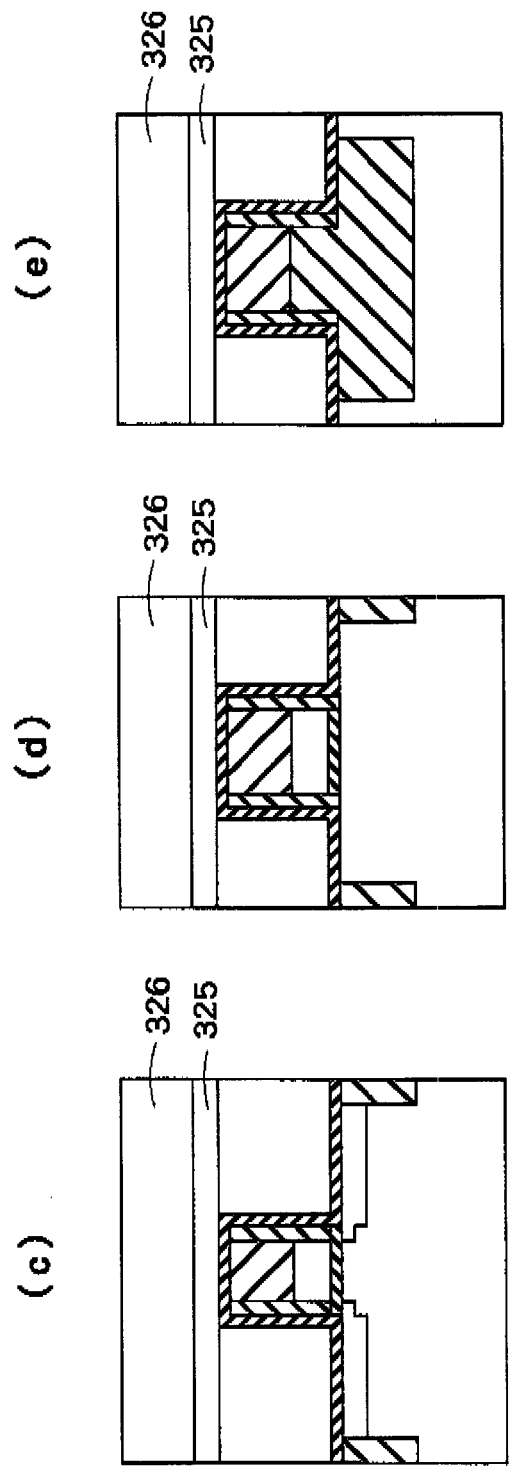
FIG. 46

FIG. 47
(a) 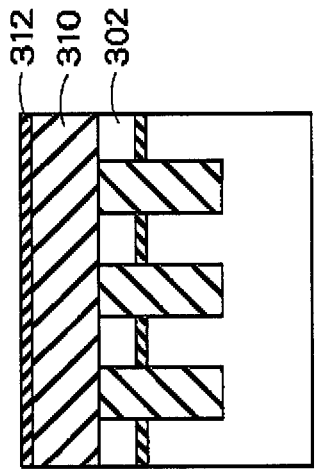
312
310
302
(b) 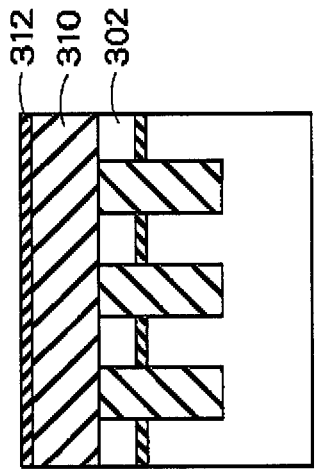
312
310
302
(c) 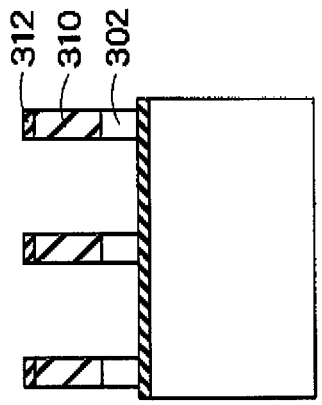
(d) 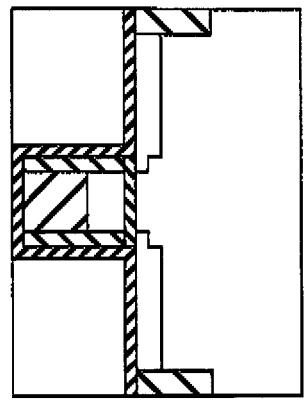
(e) 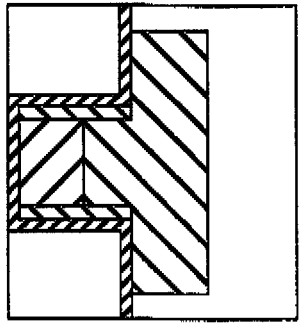

FIG. 48
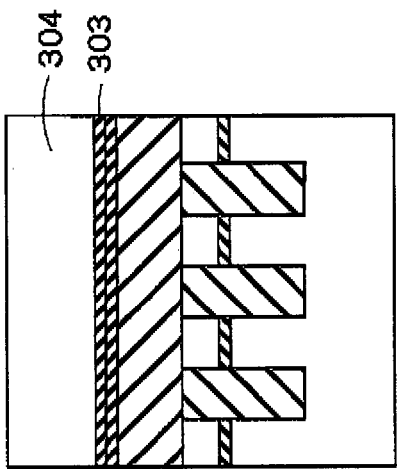
(b)
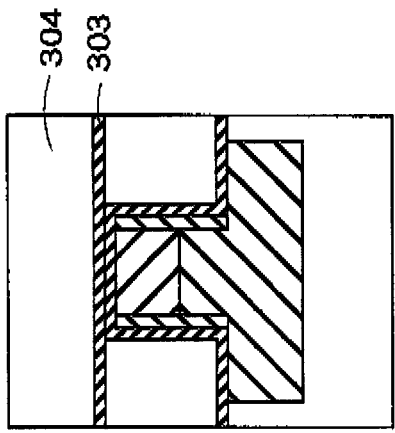
(e)
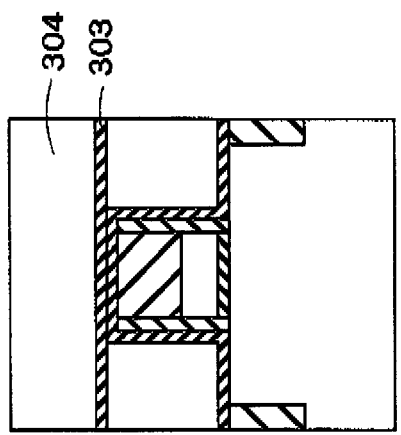
(d)
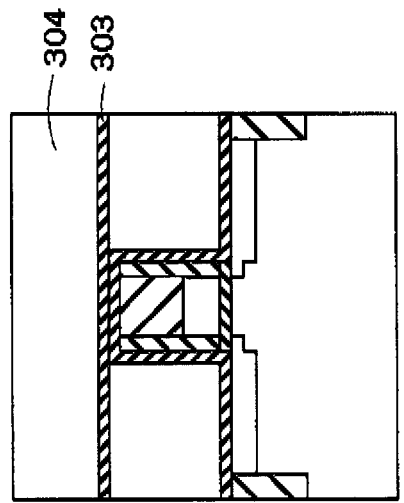
(c)

FIG. 49
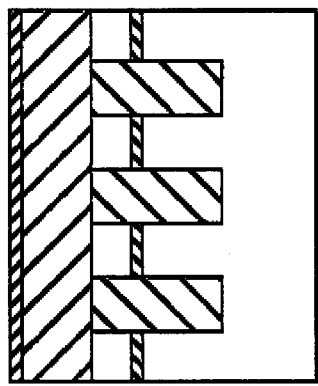
(b)
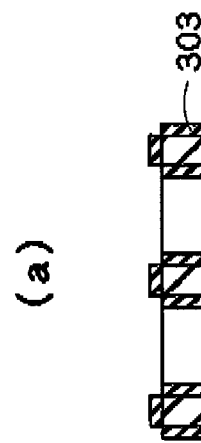
(a)
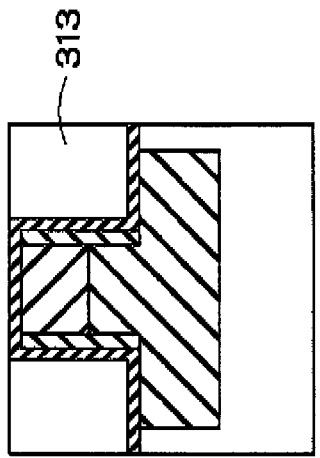
(e)
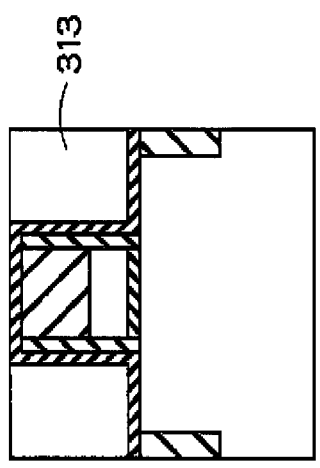
(d)
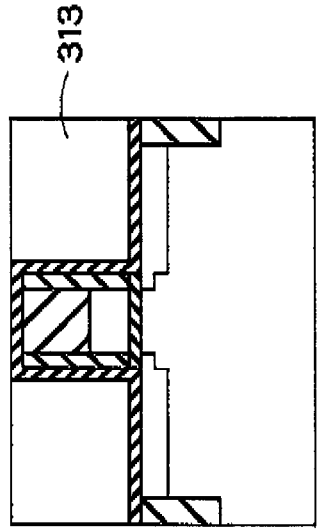
(c)

FIG. 50
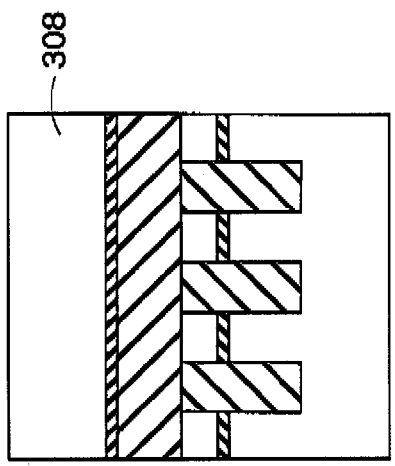
(a)
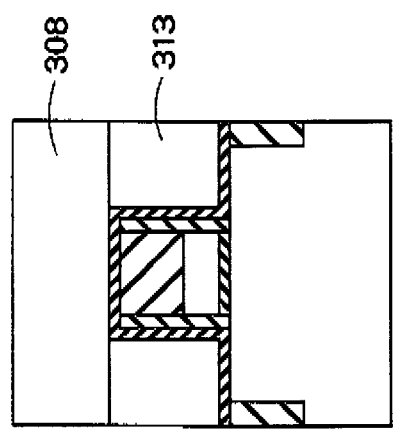
(b)
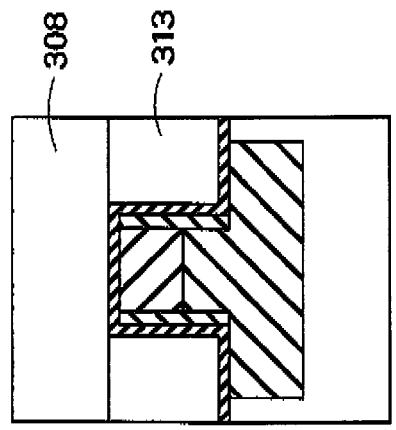
(e)
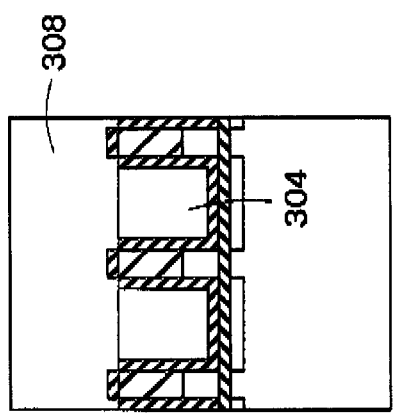
(c)
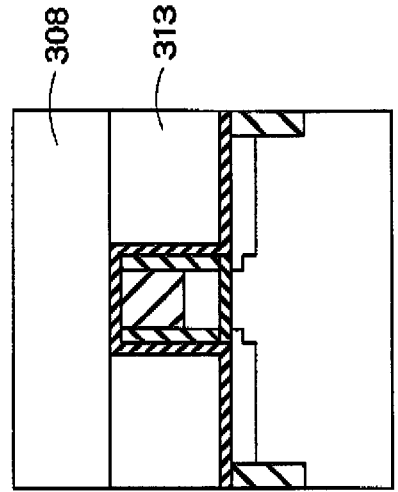
(d)

FIG. 51
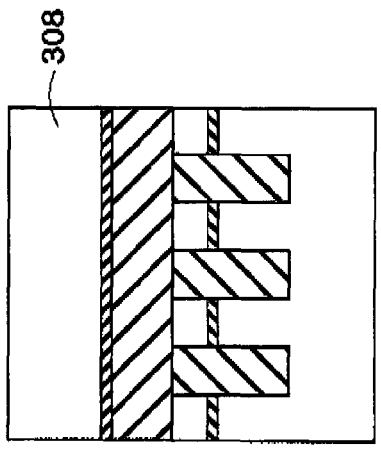
(b)
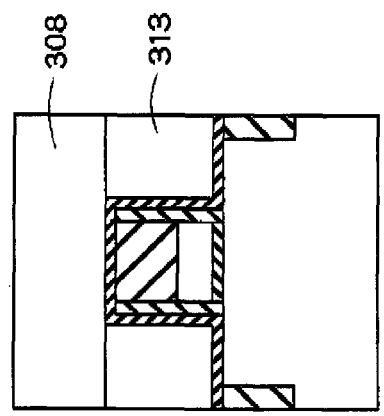
(d)
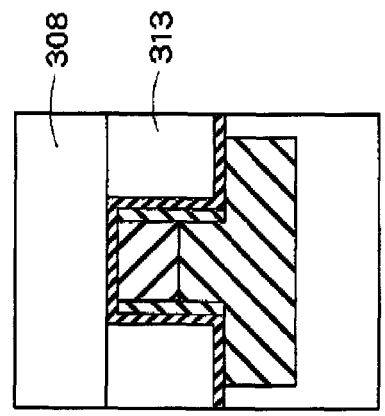
(e)
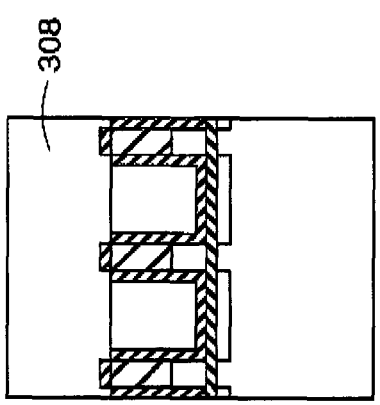
(a)
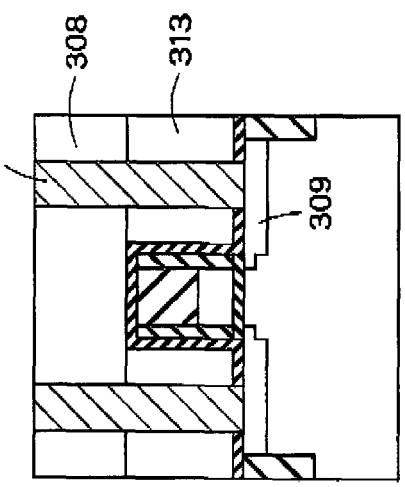
(c)

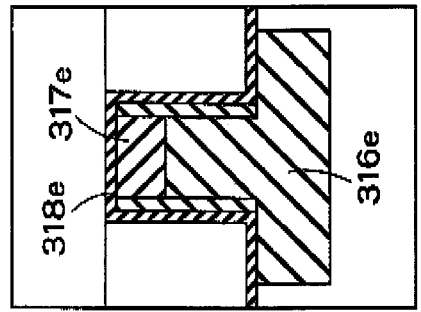
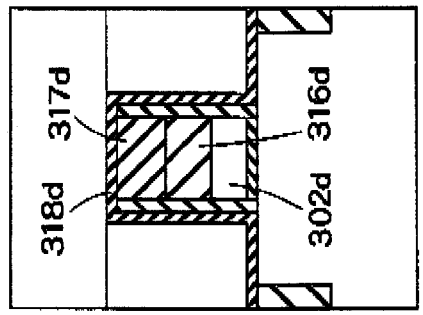
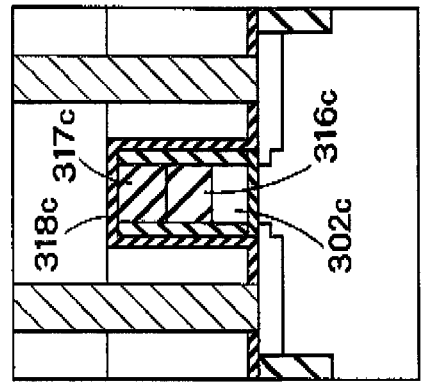
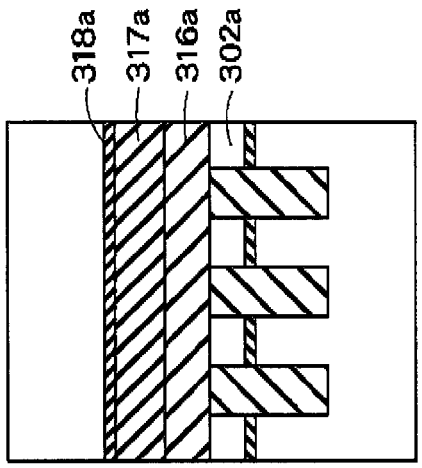
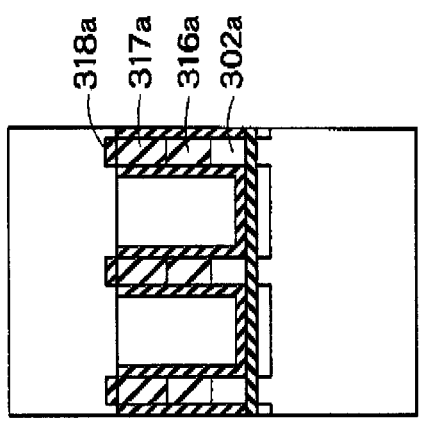
FIG. 52

SEMICONDUCTOR DEVICE, METHOD FOR MANUFACTURING SEMICONDUCTOR DEVICE, AND METHOD FOR MANUFACTURING SEMICONDUCTOR MEMORY DEVICE

CROSS REFERENCE TO RELATED APPLICATIONS

This application is based upon and claims the benefit of priority from the Japanese Patent Application No. 2007-269391, filed on Oct. 16, 2007, the entire contents of which are incorporated herein by reference.

BACKGROUND OF THE INVENTION

The present invention relates to a semiconductor device, a method for manufacturing the semiconductor device, and a method for manufacturing a semiconductor memory device.

Interconnects and the like are formed on an interlayer insulating film formed on a semiconductor substrate. In order to achieve the high integration of the interconnects and the like along with the miniaturization of a semiconductor device, it is required to maintain the planarity of this interlayer insulating film.

In the planarization process of the interlayer insulating film by means of chemical-mechanical polishing (CMP), the polishing rate differs between a region where a gate pattern density is high and a region where the density is low. Consequently, this process has had the problem that a step arises in the upper surface of the polished interlayer insulating film.

In order to solve such a problem as described above, there has been proposed a method for further planarizing the interlayer insulating film by forming a dummy pattern in a region where a gate pattern density is low or no gate patterns are formed (for example, an element-isolating region) to uniformize the gate pattern density and reduce the difference in polishing rate (see, for example, Japanese Patent Laid-Open Nos. 2003-243617 and 2004-349622).

Now, an explanation will be made of an example of a method for manufacturing semiconductor device using such a method as described above. First, desired well and channel regions are formed in a semiconductor substrate. Then, a gate insulating film, a polysilicon film to serve as a gate electrode, and a first silicon nitride film to serve as a CMP stopper film are successively formed on the semiconductor substrate.

Then, a photoresist is formed in a desired region using a lithography technique. Using this photoresist as a mask, the first silicon nitride film, the polysilicon film, the gate insulating film and the semiconductor substrate are RIE (reactive ion etching)—processed to form a trench.

Subsequently, a first silicon dioxide film is deposited so as to fill the trench. Using the first silicon nitride film as a stopper, this first silicon dioxide film is planarized by means of CMP to form an element-isolating region (STI).

Subsequently, a photoresist is formed using a lithography technique, so as to shape into desired gate and dummy patterns. Then, RIE processing is performed using the photoresist as a mask.

At this time, the desired gate and dummy patterns having the gate insulating film, the polysilicon film and the first silicon nitride film are formed in an active area (element region separated by the element-isolating region). In addition, a dummy pattern composed of the first silicon dioxide film is formed in the element-isolating region.

Subsequently, impurity-diffused layers to serve as source and drain regions and gate sidewall films are formed. Then, a second silicon nitride film for covering the gate and dummy patterns and a BPSG (Boron Phosphorus Silicon Glass) film to serve as an interlayer insulating film are formed.

Subsequently, this BPSG film is planarized by means of CMP using the second silicon nitride film as a stopper. Then, a second silicon dioxide film is formed on the BPSG film to form a contact plug for contact with the impurity-diffused layer.

The gate and dummy patterns of the active area have the first silicon nitride film in a layer underlying the second silicon nitride film. On the other hand, the dummy pattern of the element-isolating region is such that a layer underlying the second silicon nitride film is the first silicon dioxide film. That is, the thickness of a silicon nitride film to serve as a stopper at the time of CMP is smaller in the element-isolating region than in the active area.

Accordingly, if the second silicon nitride film of the dummy pattern in the element-isolating region is entirely etched away when planarizing the BPSG film by CMP, the first silicon dioxide film underlying the second silicon nitride film is abraded. Consequently, the height of the dummy pattern in the element-isolating region becomes smaller than the heights of the gate and the dummy patterns in the active area, thus giving rise to a step therebetween. This step can be a cause for a short-circuit in an upper interconnect layer and for a yield decrease. In addition, this step may degrade an interlayer breakdown voltage.

SUMMARY OF THE INVENTION

According to one aspect of the present invention, there is provided a method for manufacturing a semiconductor device, comprising:

forming a first insulating film on a semiconductor substrate;

forming an electrode layer on said first insulating film;

etching said electrode layer, said first insulating film and said semiconductor substrate of a first predetermined region to form a trench;

burying an element-isolating insulating film in said trench;

forming a second insulating film on said element-isolating insulating film and above said electrode layer;

etching said second insulating film, said electrode layer and said element-isolating insulating film of a second predetermined region to form a gate pattern and a dummy pattern;

forming a third insulating film for covering said gate pattern and said dummy pattern; and planarizing said third insulating film using said second insulating film as a stopper.

According to one aspect of the present invention, there is provided a method for manufacturing a semiconductor memory device, comprising:

forming a first insulating film on a semiconductor substrate;

forming a first electrode layer on said first insulating film;

etching said first electrode layer, said first insulating film and said semiconductor substrate of a first predetermined region to form a first trench;

burying an element-isolating insulating film in said first trench;

forming a second insulating film on said element-isolating insulating film and above said first electrode layer;

etching said second insulating film, said first electrode layer and said element-isolating insulating film of a second predetermined region in a peripheral circuit region to form a gate pattern and a dummy pattern;

forming a third insulating film for covering said gate pattern, said dummy pattern, and said second insulating film of a memory cell array region;

planarizing said third insulating film using said second insulating film as a stopper;

etching said second insulating film and said first electrode layer at predetermined spacings along a predetermined direction in said memory cell array region to form a second trench;

forming a fourth insulating film to serve as an inter-poly insulating film on the bottom face and side surfaces of said second trench; and burying a second electrode layer in said second trench to form a word line.

According to one aspect of the present invention, there is provided a semiconductor device comprising:

a semiconductor substrate;

a gate pattern having a gate insulating film, a gate electrode and a first insulating film successively laminated on said semiconductor substrate;

a first interlayer insulating film formed so as to cover said gate pattern;

an element-isolating region composed of an element-isolating insulating film buried in a surface of said semiconductor substrate;

a dummy pattern formed in said element-isolating region, having said element-isolating insulating film and a second insulating film formed thereon, and not including said gate electrode; and a second interlayer insulating film formed so as to cover said dummy pattern, wherein assuming that a height from the upper surface of said semiconductor substrate to the upper surface of said first interlayer insulating film is "Ha" and a height from the upper surface of said semiconductor substrate to the upper surface of said second interlayer insulating film is "Hc", then $0.8 \times Ha \leqq Hc$ holds true.

BRIEF DESCRIPTION OF THE DRAWINGS

FIG. 5 is a sectional view showing a step of subsequent to FIG. 4;

FIG. 10 is a sectional view showing a step of subsequent to FIG. 9;

FIG. 11 is a sectional view showing a step of subsequent to FIG. 10;

FIG. 17 is a sectional view showing a step of subsequent to FIG. 16;

FIG. 22A is a vertical cross-sectional view of a MOS transistor according to a comparative example;

FIG. 22B is another vertical cross-sectional view of a MOS transistor according to a comparative example;

FIG. 33 is a vertical cross-sectional view of the semiconductor memory device according to the third embodiment;

FIG. 34 is a sectional view illustrating one step of a method for manufacturing the semiconductor memory device according to the third embodiment;

FIG. 35 is a sectional view showing a step of subsequent to FIG. 34;

FIG. 36 is a sectional view showing a step of subsequent to FIG. 35;

FIG. 37 is a sectional view showing a step of subsequent to FIG. 36;

FIG. 38 is a sectional view showing a step of subsequent to FIG. 37;

FIG. 39 is a sectional view showing a step of subsequent to FIG. 38;

FIG. 40 is a sectional view showing a step of subsequent to FIG. 39;

FIG. 41 is a sectional view showing a step of subsequent to FIG. 40;

FIG. 42 is a sectional view showing a step of subsequent to FIG. 41;

FIG. 44 is a sectional view showing a step of subsequent to FIG. 43;

FIG. 45 is a sectional view showing a step of subsequent to FIG. 44;

FIG. 46 is a sectional view showing a step of subsequent to FIG. 45;

FIG. 47 is a sectional view showing a step of subsequent to FIG. 46;

FIG. 48 is a sectional view showing a step of subsequent to FIG. 47;

FIG. 49 is a sectional view showing a step of subsequent to FIG. 48;

FIG. 50 is a sectional view showing a step of subsequent to FIG. 49;

FIG. 51 is a sectional view showing a step of subsequent to FIG. 50; and

FIG. 52 is a vertical cross-sectional view of a semiconductor memory device according to an example of modification.

DESCRIPTION OF THE EMBODIMENTS

Hereinafter, embodiments of the present invention will be described according to the accompanying drawings.

First Embodiment

Figure 1:
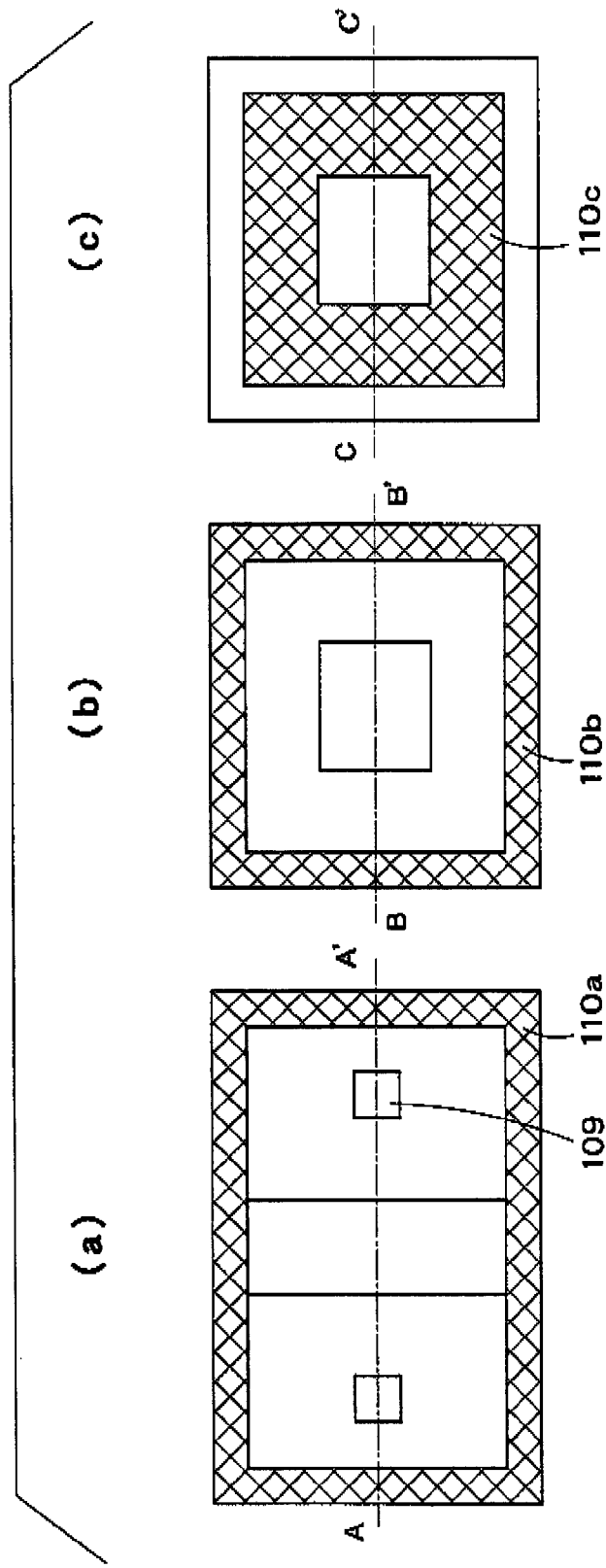
FIG. 1 is a plan view of a semiconductor device according to a first embodiment of the present invention.

FIG. 1 shows a plan view of a semiconductor device according to a first embodiment of the present invention. FIG. 1(a) shows a MOS transistor which is an element, FIG. 1(b) shows a dummy pattern in an active area, and FIG. 1(c) shows a dummy pattern in an element-isolating region. The active area is an element region separated by each of element-isolating regions 110a to 110c.

Figure 2:
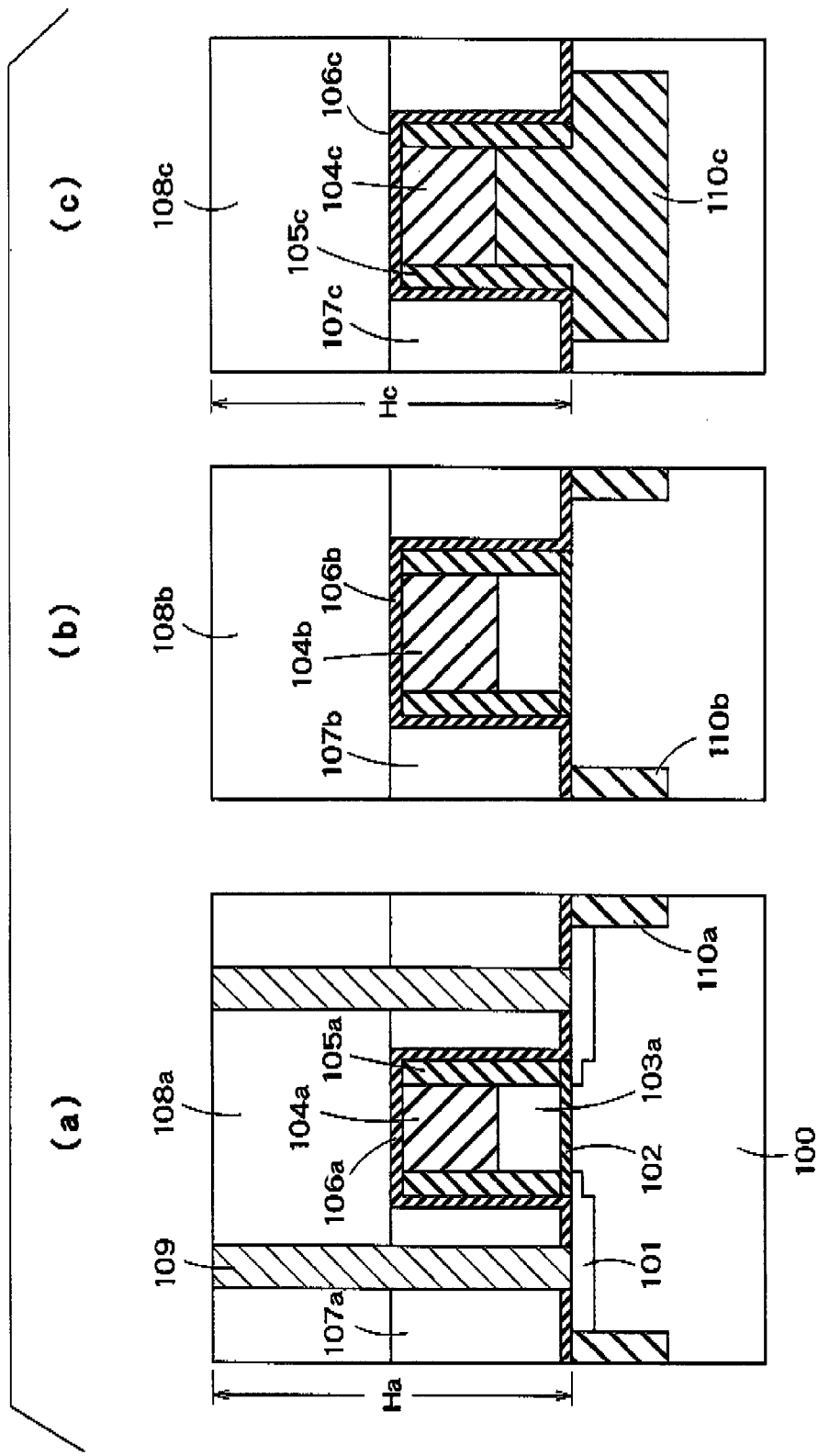
FIG. 2 is a schematic view illustrating a vertical cross-section of the semiconductor device according to the first embodiment of the present invention.

FIG. 2(a) shows a vertical cross-section as viewed along the line A-A' in FIG. 1(a), FIG. 2(b) shows a vertical cross-section as viewed along the line B-B' in FIG. 1(b), and FIG. 1(c) shows a vertical cross-section as viewed along the line C-C' in FIG. 1(c).

Now, the configuration of the MOS transistor which is an element will be described using FIG. 2(a). Diffusion layers 101 to serve as source/drain regions are formed on a surface of a semiconductor substrate 100. A gate insulating film 102, a polysilicon film 103a to serve as a gate electrode, and a silicon nitride film 104a are successively laminated between the diffusion layers 101 on the semiconductor substrate 100.

A silicon nitride film 106a is formed so as to cover sidewall films 105a and the silicon nitride film 104a. A BPSG film 107a to serve as an interlayer insulating film and a silicon dioxide film 108a are formed so as to cover the silicon nitride film 106a. In addition, there are formed contact plugs 109 penetrating through the BPSG film 107a and the silicon dioxide film 108a and having contact with the diffusion layers 101.

As shown in FIG. 2(b), the dummy pattern in the active area is configured in the same way as the MOS transistor shown in FIG. 2(a) except the presence or absence of the diffusion layers and the contact plugs.

The configuration of the dummy pattern in the element-isolating region 110c will be described using FIG. 2(c). This dummy pattern has the silicon dioxide film 110c for forming the element-isolating region and a silicon nitride film 104c formed on the silicon dioxide film 110c. A silicon nitride film 106c is formed so as to cover sidewall films 105c and the silicon nitride film 104c.

A BPSG film 107c to serve as an interlayer insulating film and a silicon dioxide film 108c are formed so as to cover the silicon nitride film 106c.

The upper surfaces of the BPSG films 107a to 107c are almost flush with the upper surfaces of the silicon nitride films 106a to 106c on the silicon nitride films 104a to 104c. In addition, the upper surfaces of the silicon dioxide films 108a, 108b and 108c are almost flush with one another.

Assuming that a height from the surface of the semiconductor substrate 100 to the upper surface of the silicon dioxide film 108a is "Ha" and a height from the surface of the semiconductor substrate 100 to the upper surface of the silicon dioxide film 108c is "Hc", then $0.8 \times Ha \leq Hc \leq Ha$ is satisfied.

As described above, it is possible to suppress a degradation in an interlayer breakdown voltage in the element-isolating region by aligning the interlayer insulating films in height so as to be almost flush with one another both in the active area and in the element-isolating region. It is also possible to prevent a short-circuit in upper interconnect layers formed on the interlayer insulating films, thereby making the semiconductor device highly reliable.

Now, an explanation will be made of a method for manufacturing such a semiconductor device as described above using the cross-sectional process drawings shown in FIGS. 3 to 14. Suffixes (a) to (c) in the respective figures correspond to suffixes (a) to (c) in FIG. 2. That is, suffix (a) denotes a vertical cross-section in a region where a MOS transistor which is an element is formed, suffix (b) denotes a vertical cross-section in a region where a dummy pattern in an active area is formed, and suffix (c) denotes a vertical cross-section in a region where a dummy pattern in an element-isolating region is formed.

Figure 3:
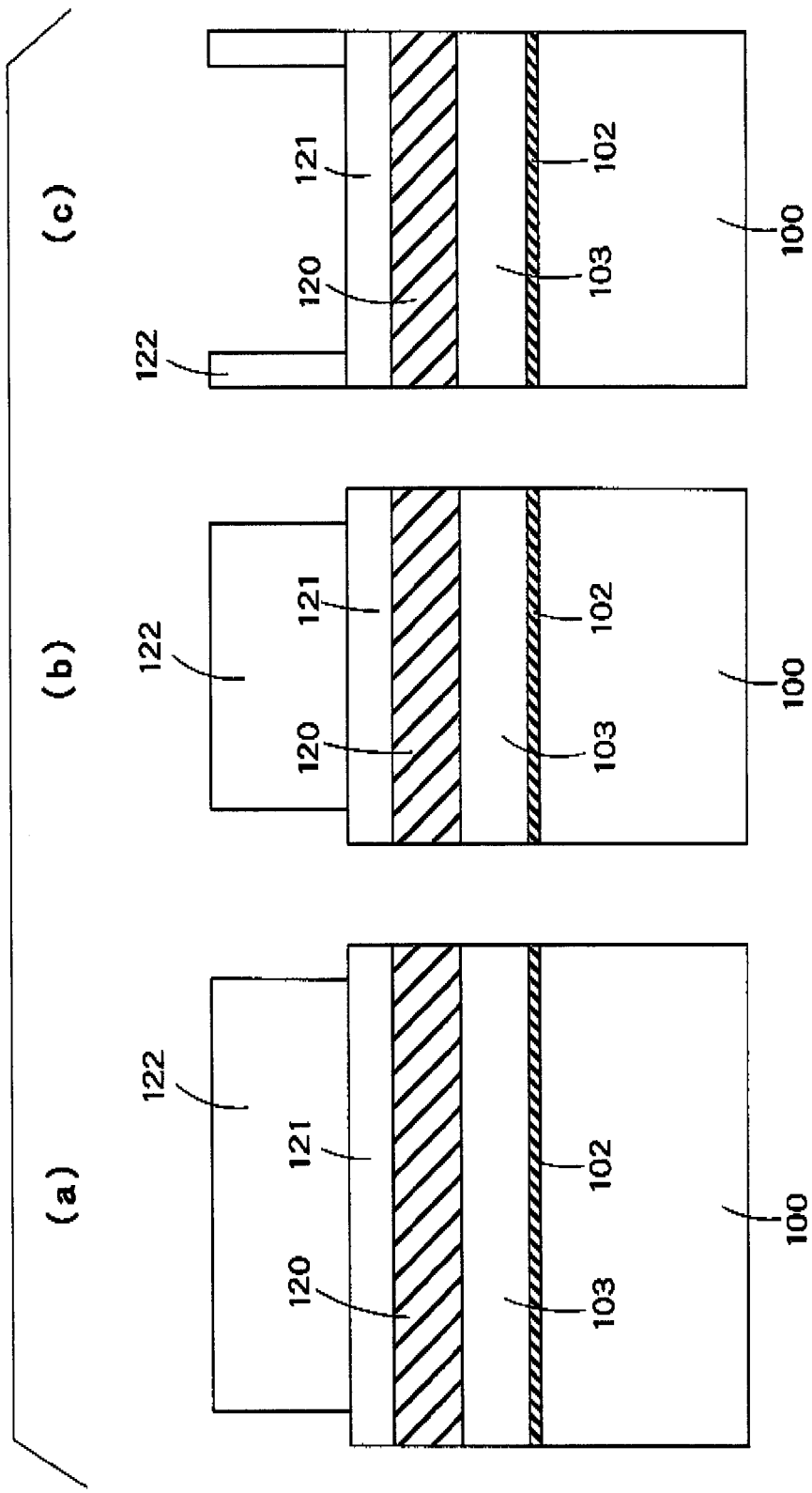
FIG. 3 is a sectional view illustrating one step of a method for manufacturing the semiconductor device according to the first embodiment.

As shown in FIG. 3, desired well and channel regions (none of which are illustrated) are formed in a semiconductor substrate 100 using an ion implantation technique, and then an 8 nm-thick gate insulating film 102 is formed on the semiconductor substrate 100. The gate insulating film 102 is, for example, a silicon dioxide film.

Subsequently, an 80 nm-thick polysilicon film 103 and an 80 nm-thick silicon nitride film 120 are successively formed on the gate insulating film 102. The polysilicon film 103 is, for example, a polysilicon film doped with phosphorous as an impurity.

Then, a 50 nm-thick antireflection film 121 is formed on the silicon nitride film 120. In addition, a 150 nm-thick photoresist 122 is formed using a lithography technique so as to shape into a desired element-isolating region pattern.

Figure 4:
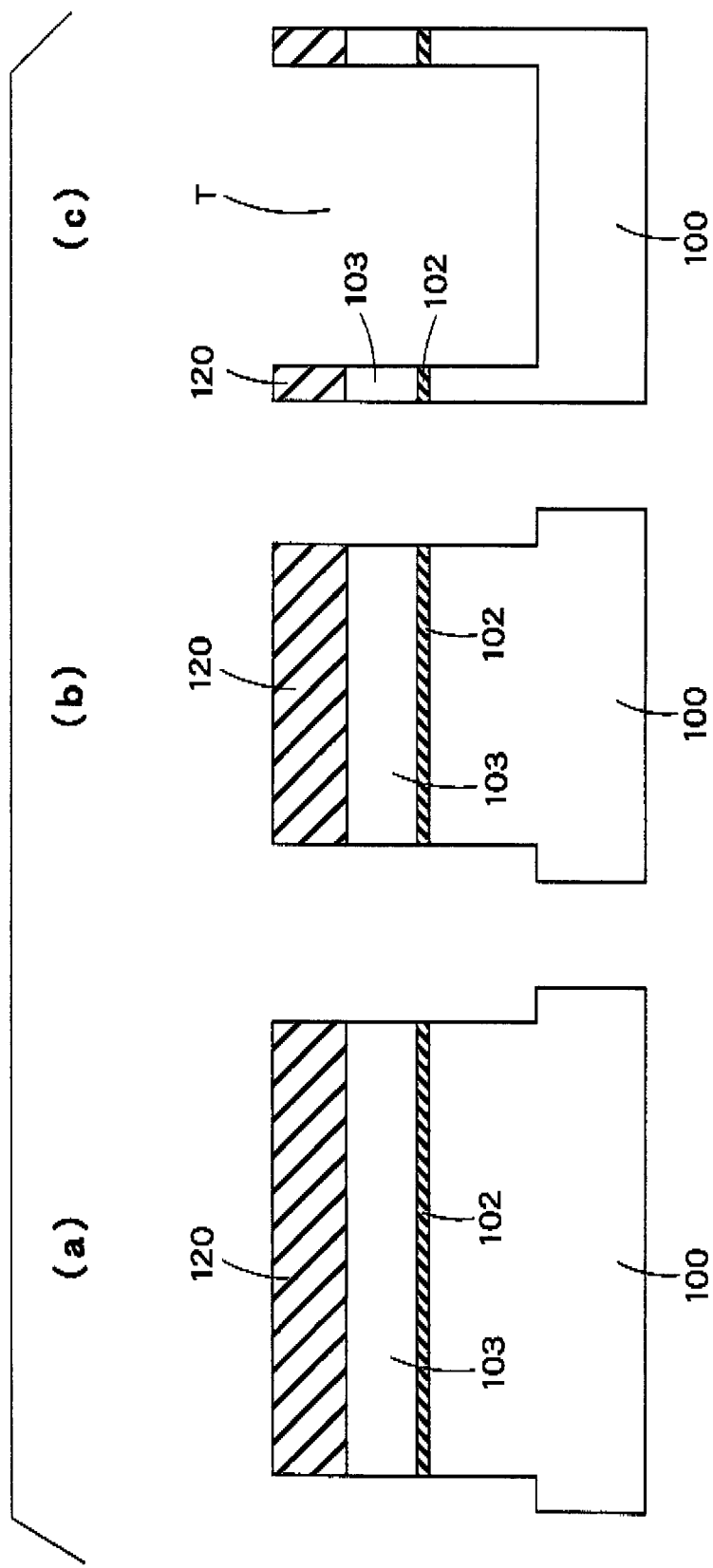
FIG. 4 is a sectional view showing a step of subsequent to FIG. 3.

As shown in FIG. 4, the antireflection film 121, the silicon nitride film 120, the polysilicon film 103, the gate insulating film 102, and the semiconductor substrate 100 are RIE-processed using the photoresist 122 as a mask to form a 250 nm-deep trench T.

Then, the photoresist 122 and the antireflection film 121 are removed using an ashing technique or the like.

As shown in FIG. 5, a 500 nm-thick silicon dioxide film 110 is formed using, for example, an HDP-CVD (High-Density Plasma CVD) technique, so as to fill the trench T.

Figure 6:
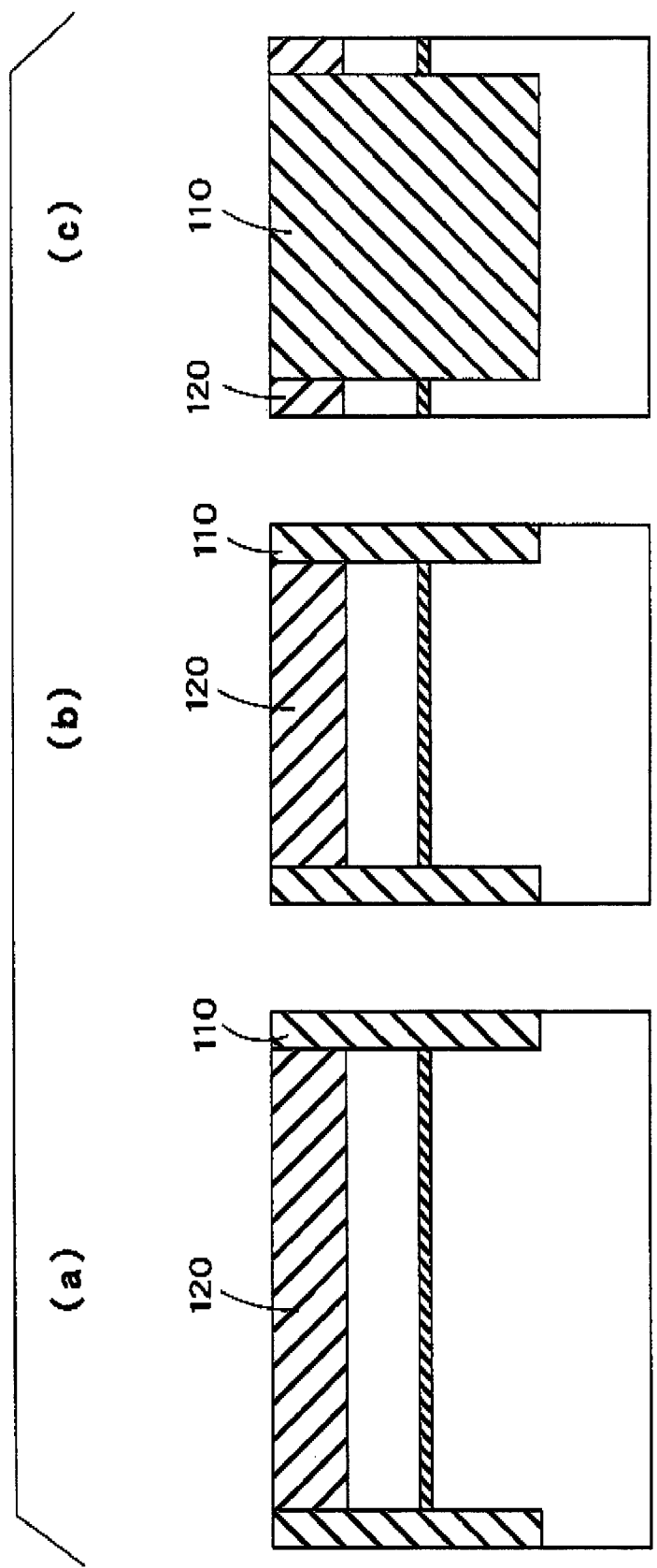
FIG. 6 is a sectional view showing a step of subsequent to FIG. 5.

As shown in FIG. 6, the silicon dioxide film 110 is planarized using a CMP technique with the silicon nitride film 120 used as a stopper.

Figure 7:
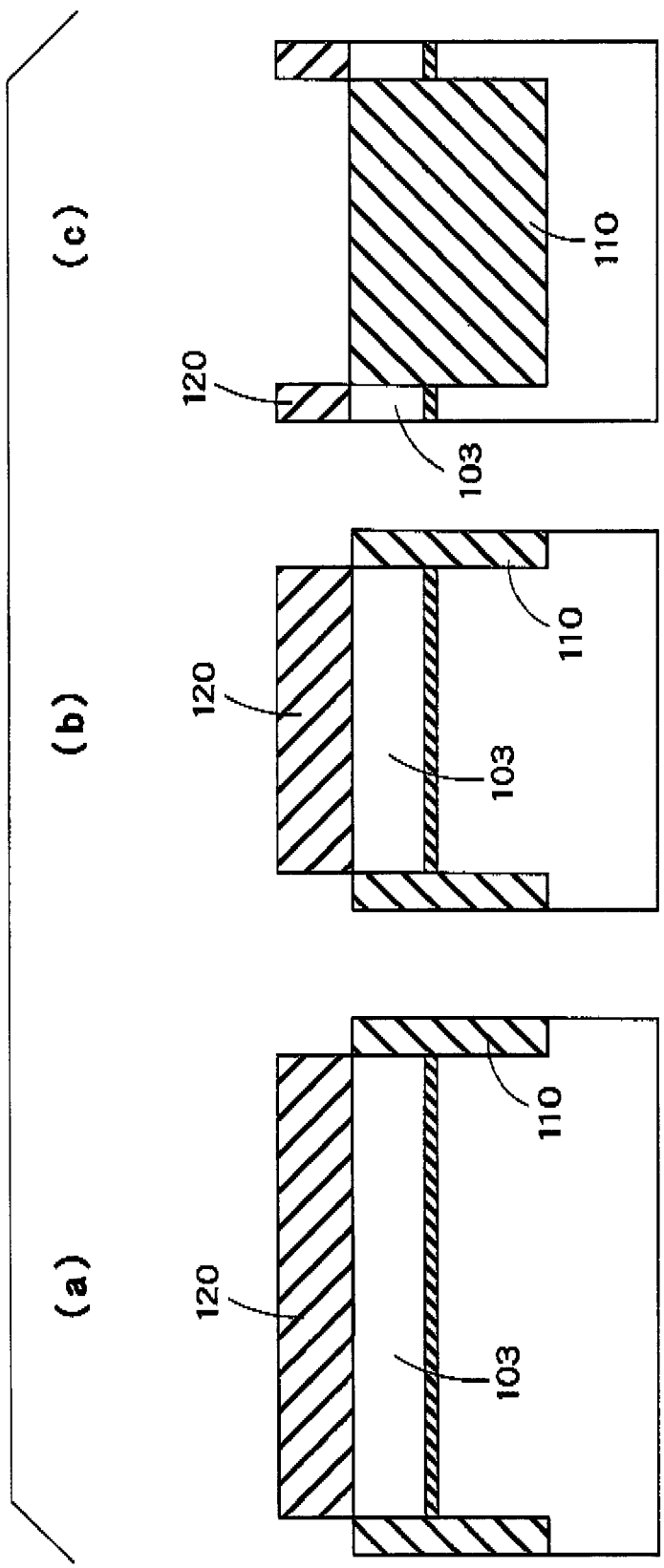
FIG. 7 is a sectional view showing a step of subsequent to FIG. 6.

As shown in FIG. 7, the silicon dioxide film 110 is RIE-processed so that the upper surface thereof is level with the upper surface of the polysilicon film 103. Wet etching may be used rather than RIE.

Figure 8:
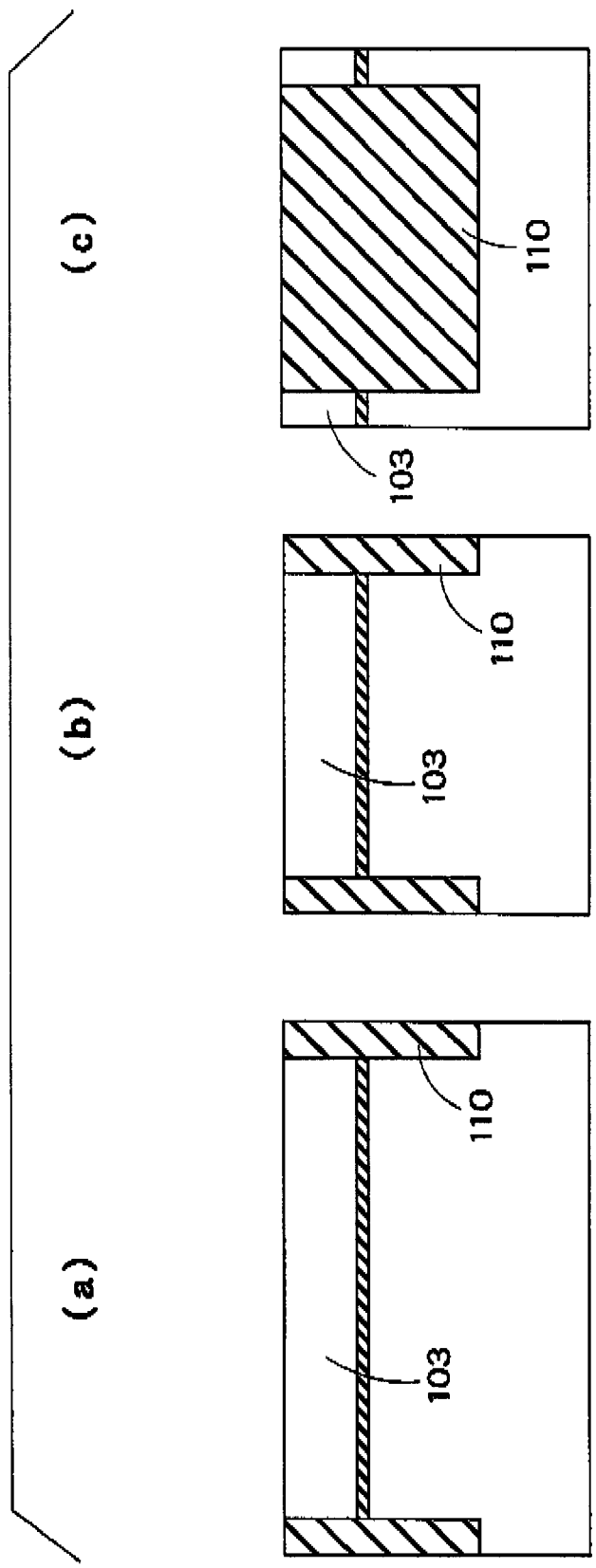
FIG. 8 is a sectional view showing a step of subsequent to FIG. 7.

As shown in FIG. 8, the silicon nitride film 120 is removed using a wet etching technique or an RIE technique.

This removal of the silicon nitride film 120 and the height adjustment of the silicon dioxide film 110 shown in FIG. 7 may be performed continuously while changing over RIE etching steps. Alternatively, the removal and the height adjustment may be performed collectively under the condition in which the etching rates of the silicon dioxide film 110 and the silicon nitride film 120 are equalized.

Figure 9:
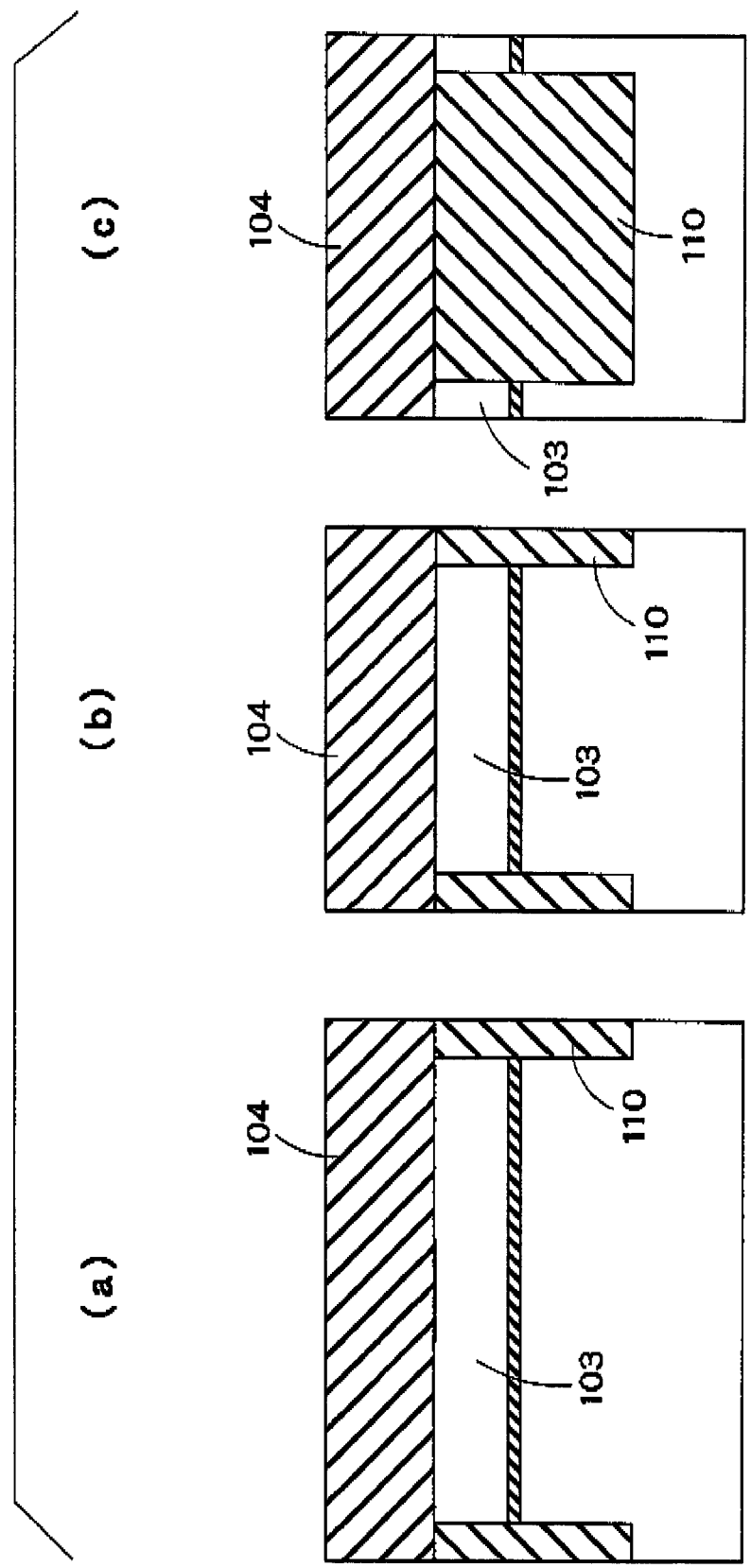
FIG. 9 is a sectional view showing a step of subsequent to FIG. 8.

As shown in FIG. 9, a 150 nm-thick silicon nitride film 104 is formed on the polysilicon film 103 and on the silicon dioxide films 110.

As shown in FIG. 10, a 50 nm-thick antireflection film 123 is formed on the silicon nitride film 104. In addition, a 150 nm-thick photoresist 124 is formed using a lithography technique, so as to shape into desired gate and dummy patterns.

As shown in FIG. 11, the antireflection film 123, the silicon nitride film 104, and the polysilicon film 103 are RIE-processed using the photoresist 124 as a mask.

If the thickness of the photoresist 124 is inadequate depending on the RIE conditions, the pattern in question may be temporarily transferred to the silicon nitride film 104 and the photoresist 124 may be removed. Then, the above-described processing may be performed using the silicon nitride film 104 as a mask. At this time, there is applied such processing as to reduce the height of the silicon dioxide film 110 to the position of the gate insulating film 102.

Subsequently, the photoresist 124 and the antireflection film 123 are removed using an ashing technique or the like.

After this, as shown in FIG. 11(a), a shallow diffusion layer region 111 is formed in a surface of the semiconductor substrate 100.

Figure 12:
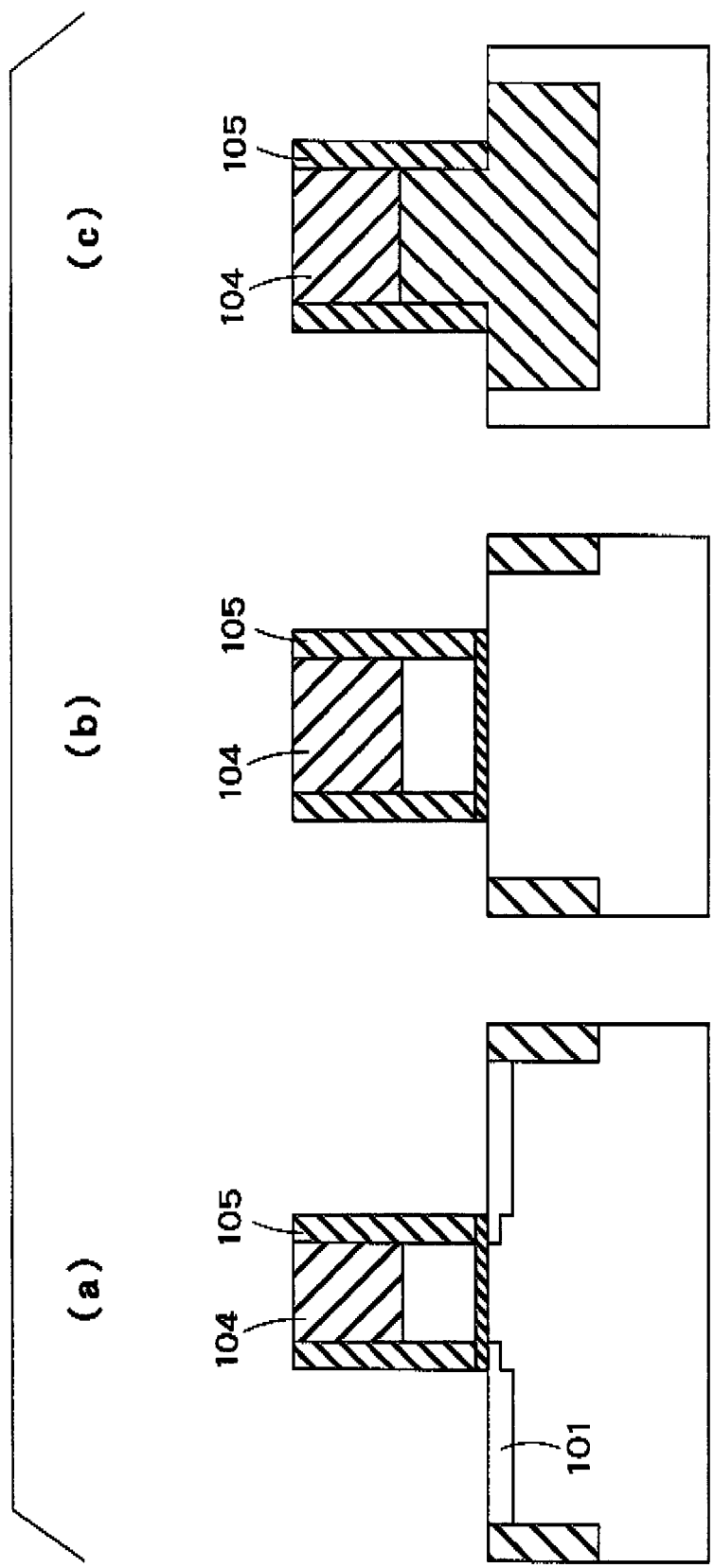
FIG. 12 is a sectional view showing a step of subsequent to FIG. 11.

As shown in FIG. 12, diffusion layers 101 to serve as source/drain regions are formed using in combination a lithography technique, an ion implantation technique, an RTA technique and the like. In order to construct an LDD (Lightly Doped Drain) structure, sidewall films 105 are formed using in combination an LP-CVD (Low-Pressure CVD) technique and an RIE technique. The sidewall films 105 are, for example, silicon dioxide films.

Figure 13:
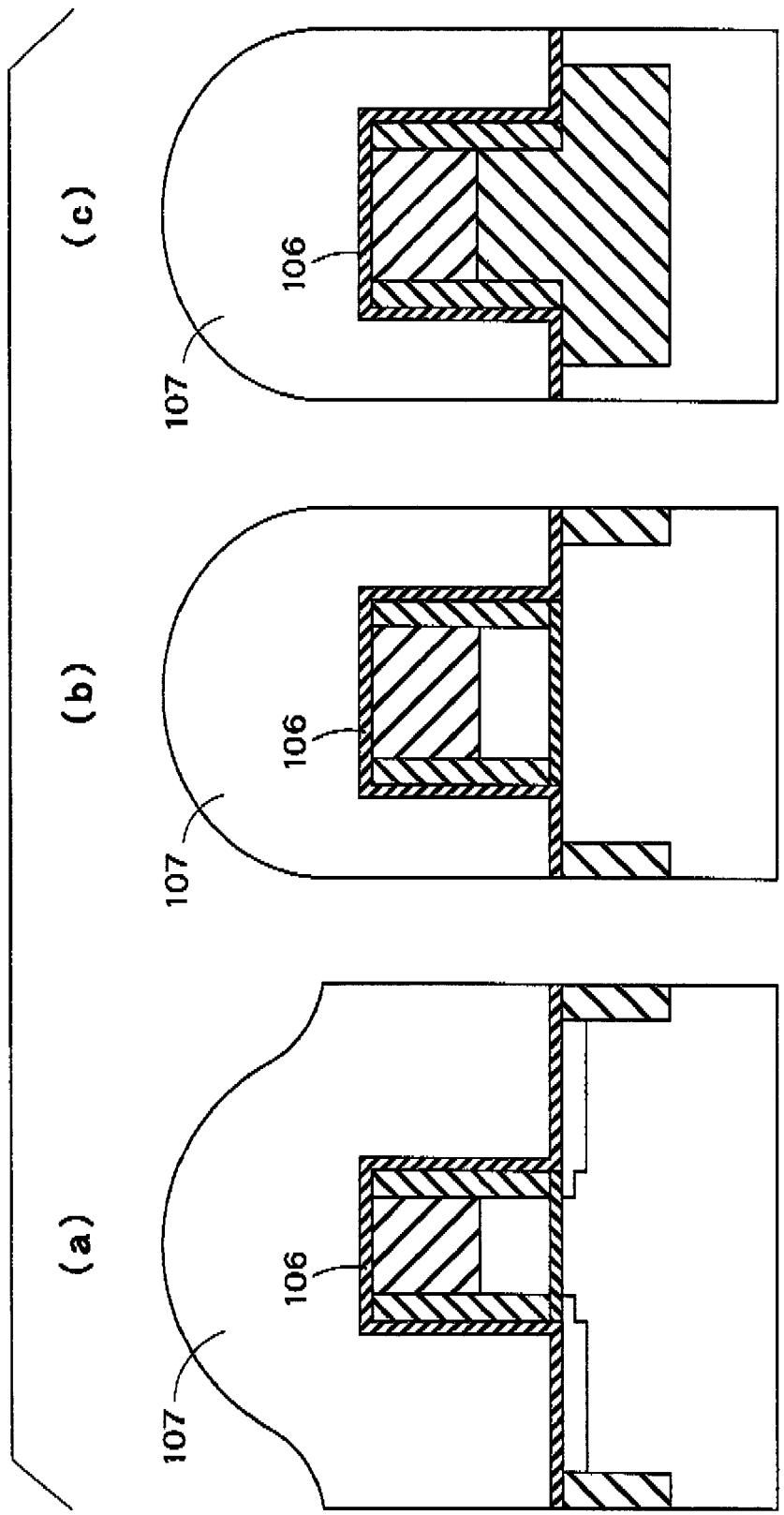
FIG. 13 is a sectional view showing a step of subsequent to FIG. 12.

As shown in FIG. 13, a 20 nm-thick silicon nitride film 106 is formed so as to cover the gate and dummy patterns. Then, a 600 nm-thick BPSG film 107 for composing an interlayer insulating film is formed and subjected to reflow by heat treatment.

Figure 14:
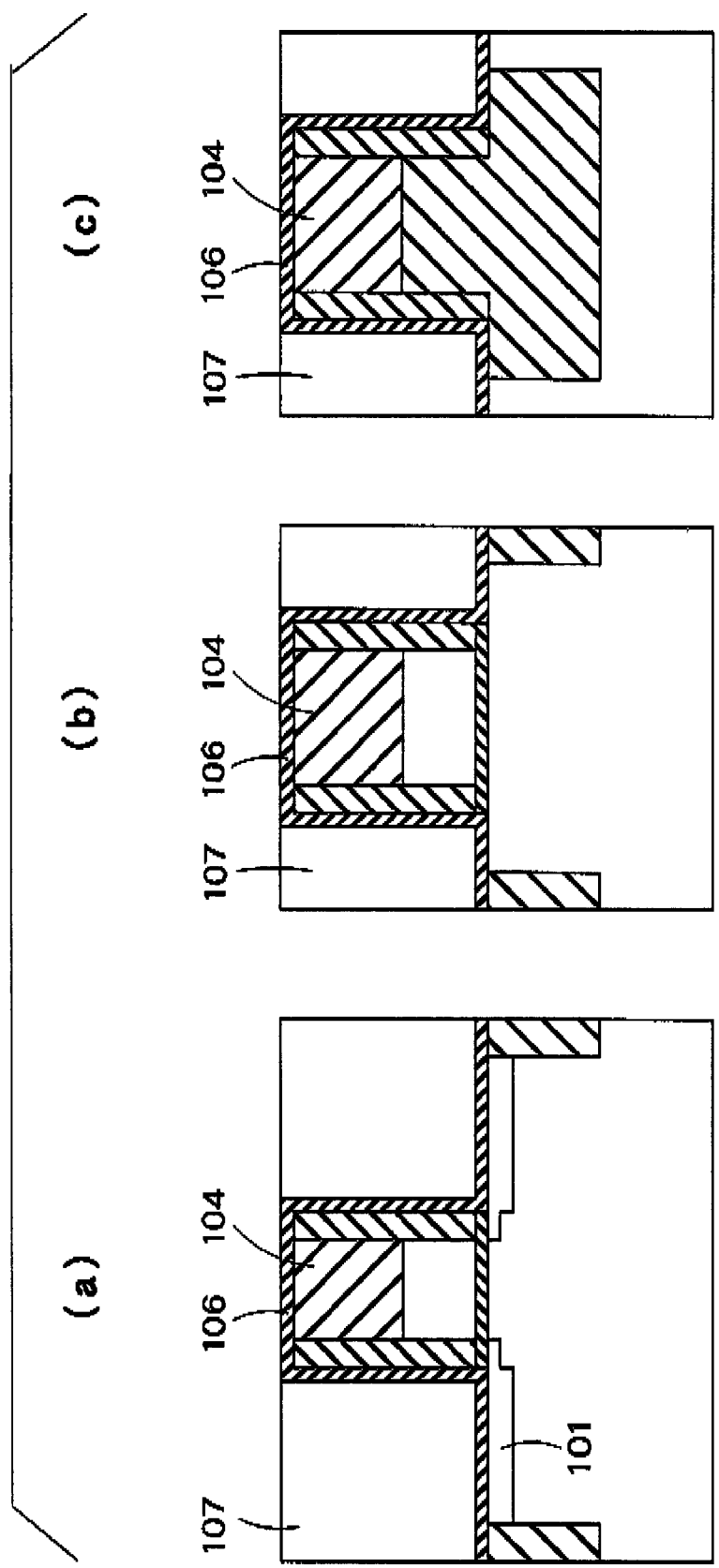
FIG. 14 is a sectional view showing a step of subsequent to FIG. 13.

As shown in FIG. 14, the BPSG film 107 is planarized using a CMP technique. The silicon nitride film 106 serves as a stopper. If the polishing rate becomes faster in the element-isolating region than in the active area due to a difference in pattern density or the like, the silicon nitride film 104 also functions as a stopper.

Consequently, the BPSG film 107 can be made almost uniform in height both in the active area and in the element-isolating region.

Figure 15:
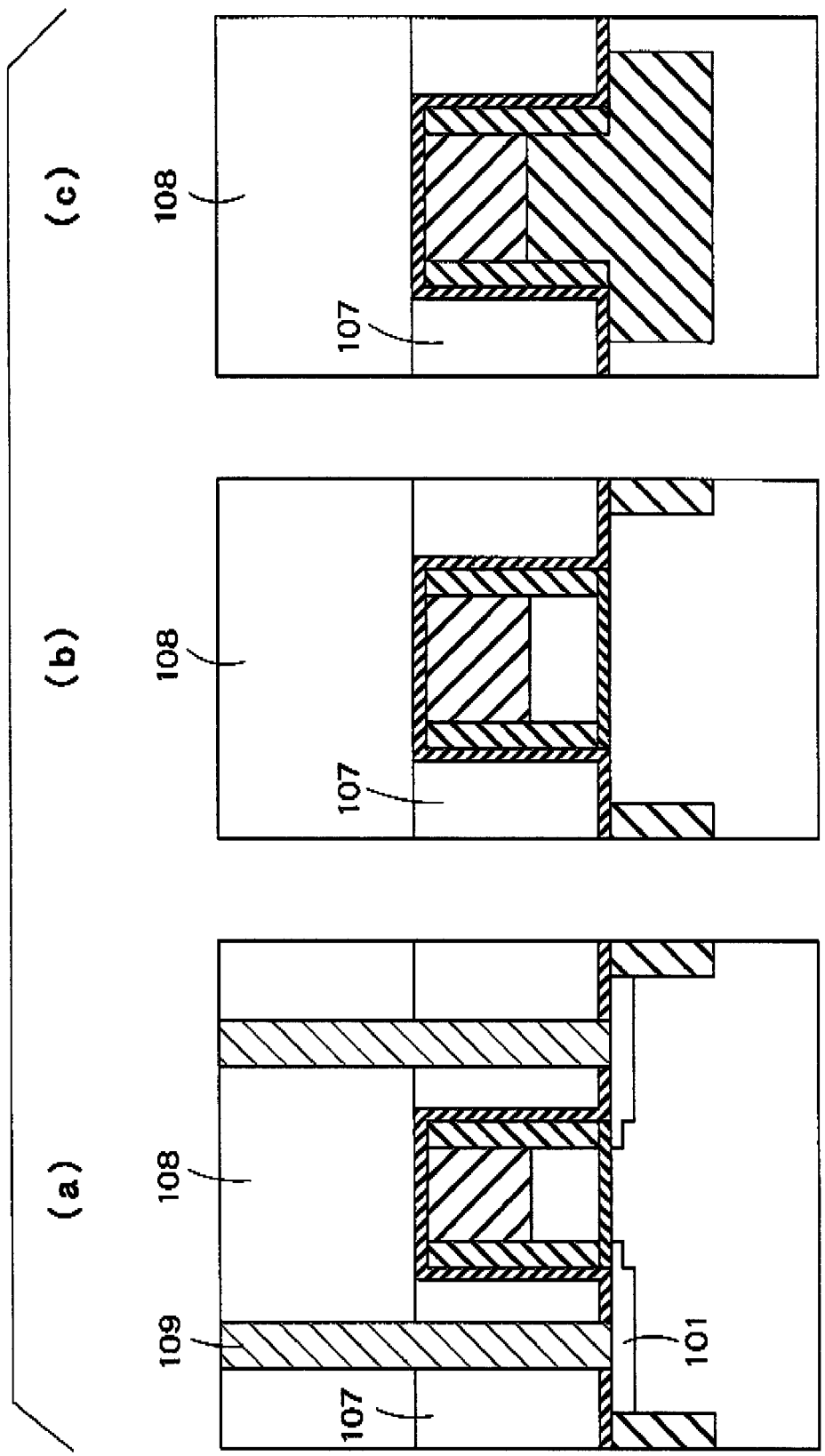
FIG. 15 is a sectional view showing a step of subsequent to FIG. 14.

As shown in FIG. 15, a 300 nm-thick silicon dioxide film 108 for composing an interlayer insulating film is formed. Then, there are made contact holes penetrating through the silicon dioxide film 108 and the BPSG film 107 and exposing the upper surfaces of the diffusion layers 101, and contact plugs 109 are formed in the holes.

Since the BPSG film is made almost uniform in height in the step shown in FIG. 14, it is possible to suppress a variation in the height of the interlayer insulating film between the active area and the element-isolating region and make the upper surface of the interlayer insulating film almost planar.

COMPARATIVE EXAMPLE

A method for manufacturing a semiconductor device according to a comparative example will be described using FIGS. 16 to 22. Since the comparative example is the same as the above-described first embodiment up to a step of planarizing the silicon dioxide film 110 using a CMP technique with the silicon nitride film 120 used as a stopper (corresponds to FIG. 6), the same steps will not be explained again.

Figure 16:
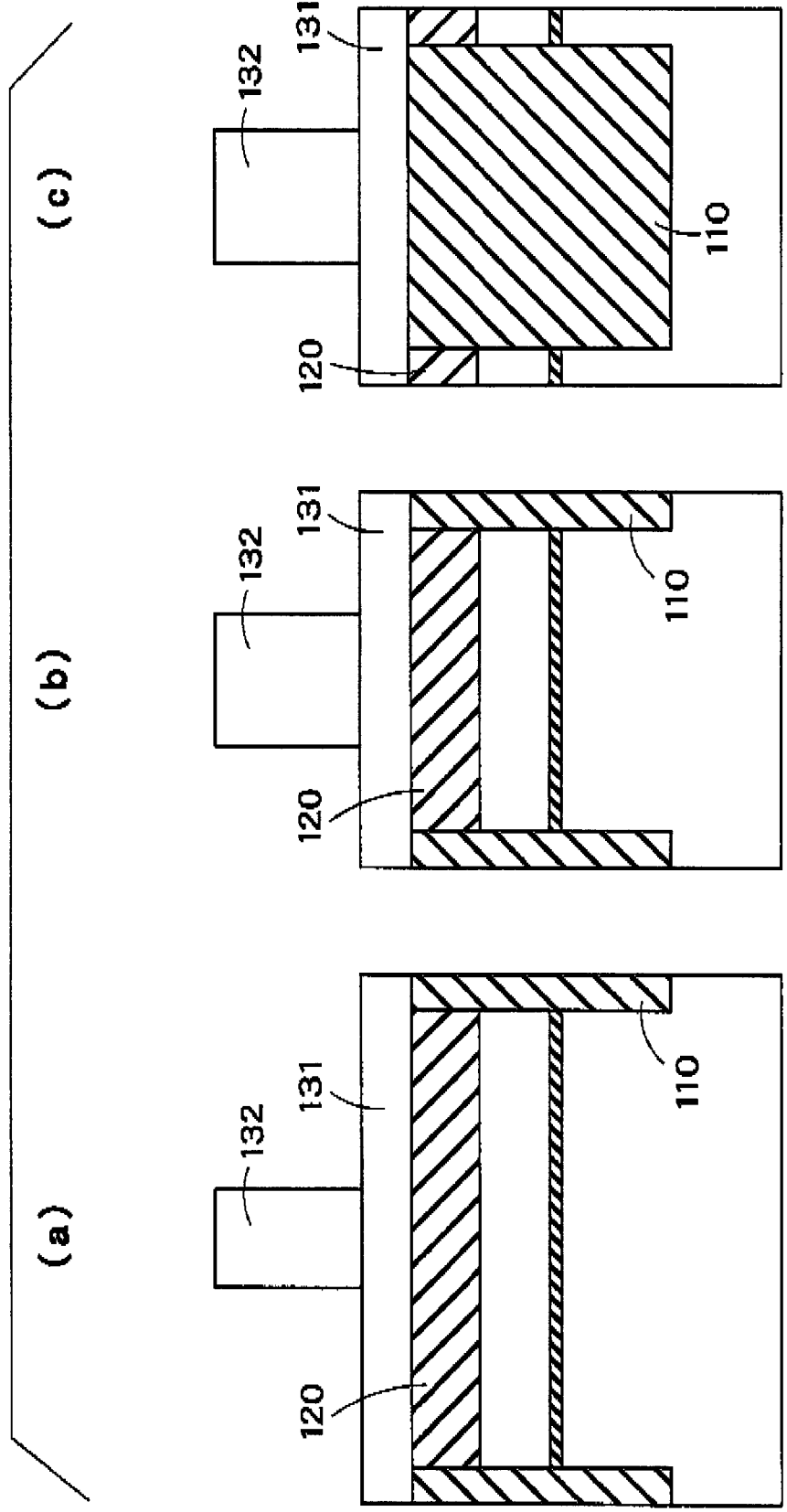
FIG. 16 is a sectional view illustrating one step of a method for manufacturing a semiconductor device according to a comparative example.

As shown in FIG. 16, an antireflection film 131 is formed on the silicon nitride film 120 and the silicon dioxide film 110. Using a lithography technique, a photoresist 132 is formed so as to shape into desired gate and dummy patterns.

As shown in FIG. 17, the antireflection film 131, the silicon nitride film 120 and the polysilicon film 103 are RIE-processed using the photoresist 132 as a mask. At this time, there is applied such processing as to reduce the height of the silicon dioxide film 110 to the position of the gate insulating film 102.

Subsequently, the photoresist 132 and the antireflection film 131 are removed using an ashing technique or the like.

After this, as shown in FIG. 17(a), shallow diffusion layer regions 111 are formed on the surface of the semiconductor substrate 100.

Figure 18:
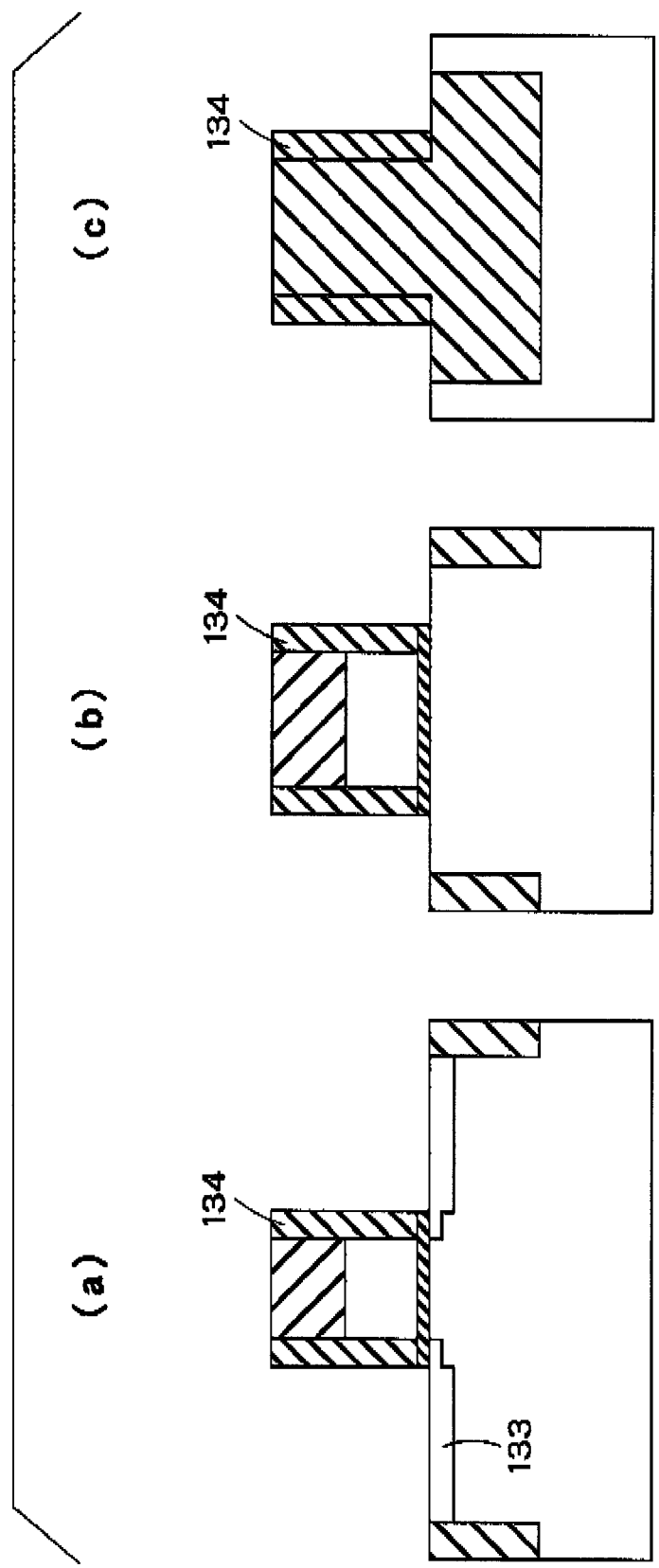
FIG. 18 is a sectional view showing a step of subsequent to FIG. 17.

As shown in FIG. 18, diffusion layers 133 to serve as source/drain regions are formed using in combination a lithography technique, an ion implantation technique, an RTA technique and the like. In order to construct an LDD (Lightly Doped Drain) structure, sidewall films 134 are formed using in combination an LP-CVD (Low-Pressure CVD) technique and an RIE technique. The sidewall films 134 are, for example, silicon dioxide films.

Figure 19:
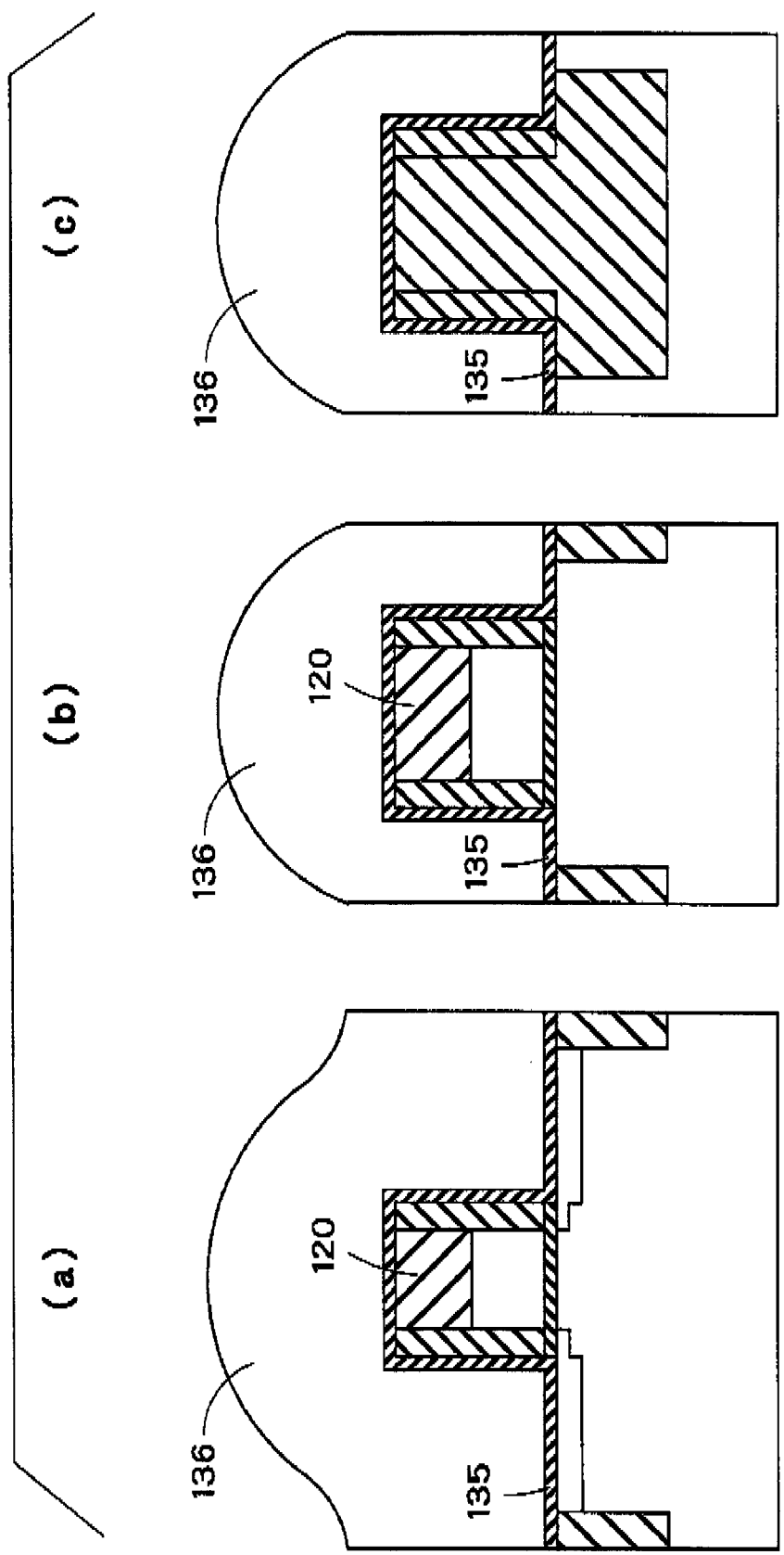
FIG. 19 is a sectional view showing a step of subsequent to FIG. 18.

As shown in FIG. 19, a silicon nitride film 135 is formed so as to cover the gate and dummy patterns. Then, a BPSG film 136 for composing an interlayer insulating film is formed and subjected to reflow by heat treatment.

Figure 20:
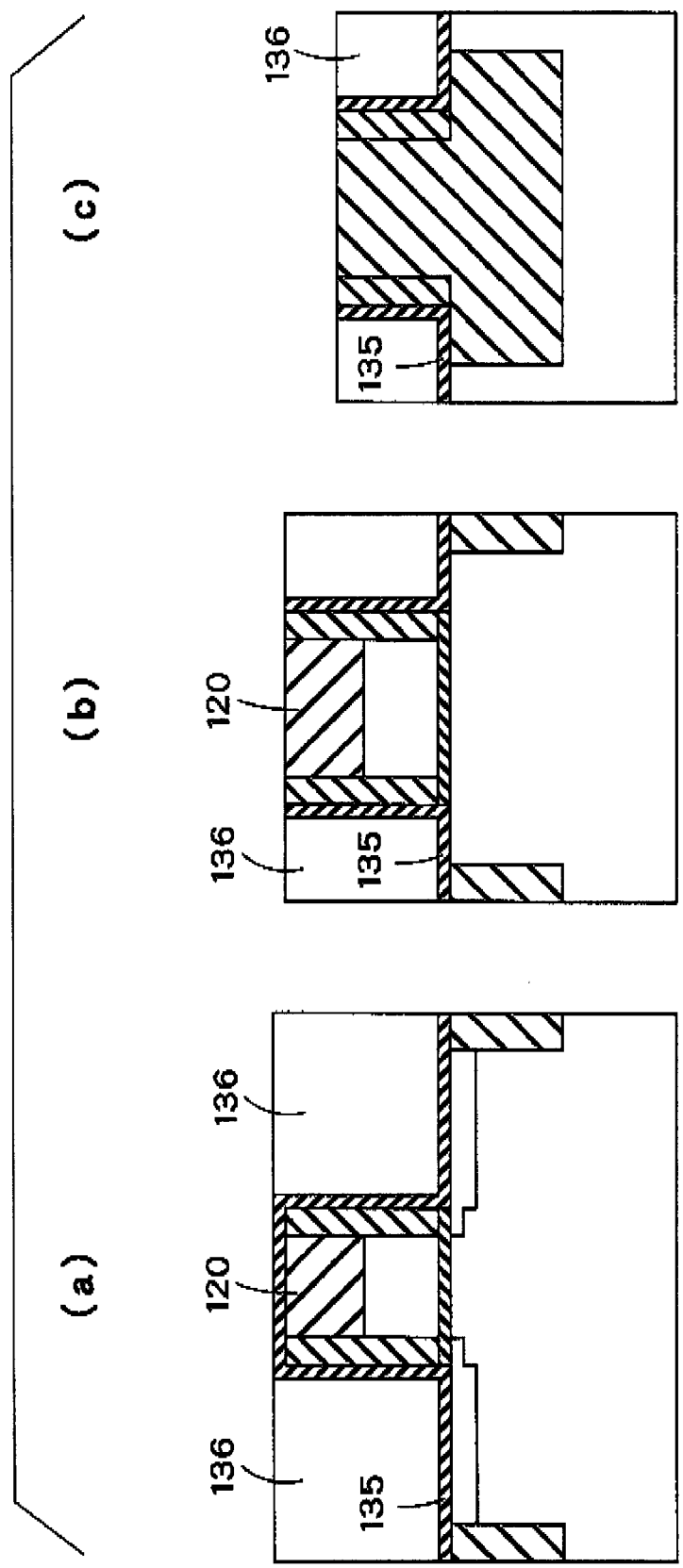
FIG. 20 is a sectional view showing a step of subsequent to FIG. 19.

As shown in FIG. 20, a BPSG film 136 is planarized using a CMP technique. At this time, the silicon nitride films 135 and 120 serve as stoppers in the active area. On the other hand, only the silicon nitride film 135 serves as a stopper in the element-isolating region.

Accordingly, erosion tends to take place in the element-isolating region as shown in FIG. 20(c), thus causing a difference in the film thickness of the BPSG film 136 to become large between the active area and the element-isolating region.

Figure 21:
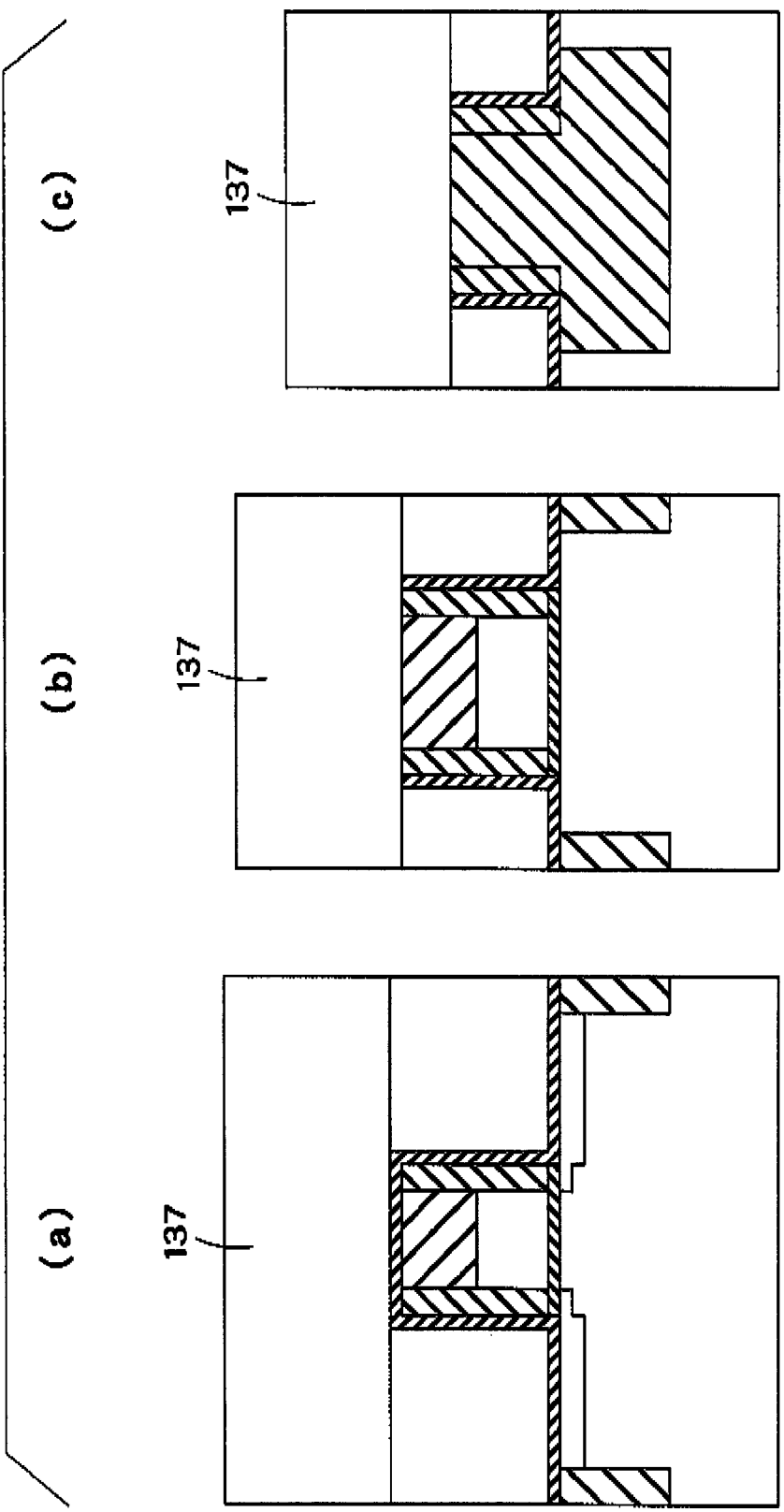
FIG. 21 is a sectional view showing a step of subsequent to FIG. 20.

As shown in FIG. 21, a silicon dioxide film 137 for composing an interlayer insulating film is formed. The height of the upper surface of the interlayer insulating film differs significantly between the active area and the element-isolating region. If an upper interconnect layer is formed on such an interlayer insulating film as described above, a short-circuit or the like takes place, thus decreasing a product yield and degrading an interlayer breakdown voltage.

Erosion also takes place in an active area near the element-isolating region where erosion has occurred. If contact plugs 138 are formed in an element where erosion has occurred, the contact plugs may penetrate the diffusion layer 133 at the time of processing contact holes, as shown in FIG. 22A, since the interlayer insulating film is thin.

In addition, a defocus may take place at the time of lithography and, therefore, the contact holes may not reach to the diffusion layers 133, as shown in FIG. 22B.

As described above, in the method for manufacturing a semiconductor device according to the comparative example, a variation arises in the height of the interlayer insulating film due to erosion that occurs in the element-isolating region when planarizing the BPSG film. Consequently, there arises such problems as a short-circuit in an upper interconnect layer, a degradation in the interlayer breakdown voltage, and a failure to make contact holes.

On the other hand, in the above-described first embodiment, it is possible to prevent the occurrence of erosion since the silicon nitride film 104 and the silicon nitride film 106 also serve as stoppers in the element-isolating region as in the active area when planarizing the BPSG film.

Accordingly, it is possible to make the upper surface of the interlayer insulating film almost planer, thereby preventing a short-circuit in an upper interconnect layer formed on the interlayer insulating film. In addition, it is possible to prevent such a problem as a failure to make contact holes. Furthermore, it is possible to prevent a degradation in the interlayer breakdown voltage in the element-isolating region, thereby enabling the manufacture of a highly-reliable semiconductor device,

Second Embodiment

Figure 23:
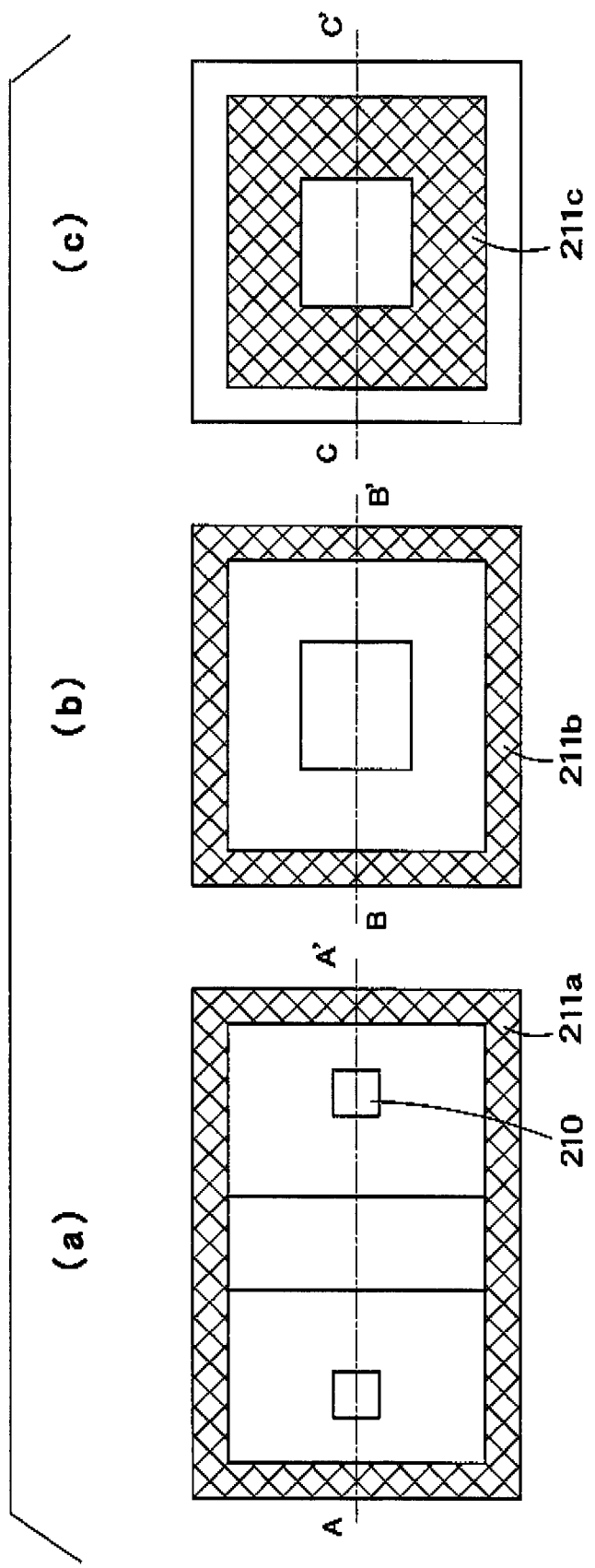
FIG. 23 is a plan view of a semiconductor device according to a second embodiment of the present invention.

FIG. 23 shows a plan view of a semiconductor device according to a second embodiment of the present invention. FIG. 23(a) shows a MOS transistor which is an element, FIG. 23(b) shows a dummy pattern in an active area, and FIG. 23(c) shows a dummy pattern in an element-isolating region. The active area is an element region separated by each of element-isolating regions 211a to 211c.

Figure 24:
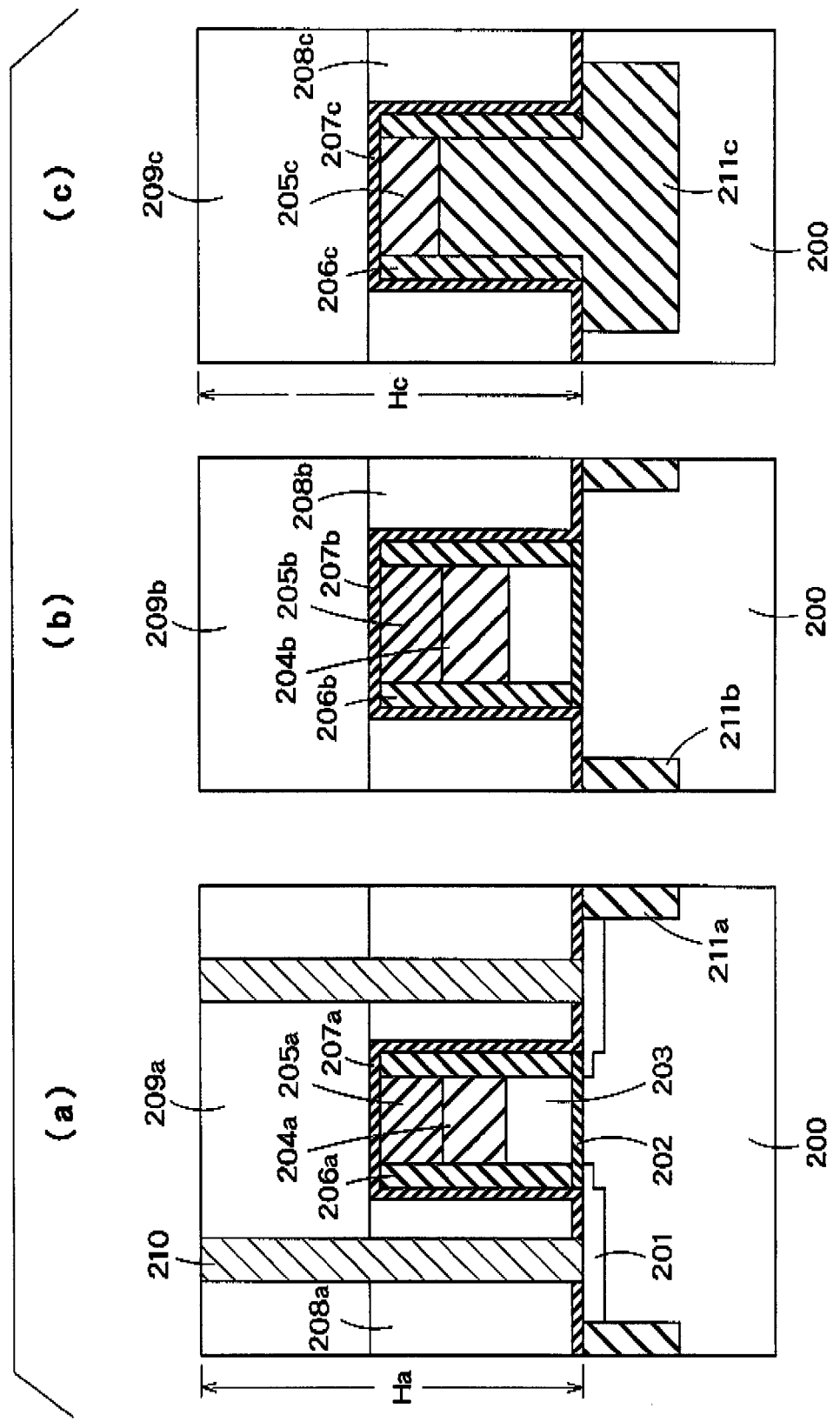
FIG. 24 is a vertical cross-sectional view of the semiconductor device according to the second embodiment.

FIG. 24(a) shows a vertical cross-section as viewed along the line A-A' in FIG. 23(a), FIG. 24(b) shows a vertical cross-section as viewed along the line B-B' in FIG. 23(b), and FIG. 24(c) shows a vertical cross-section as viewed along the line C-C' in FIG. 23(c).

Now, the configuration of the MOS transistor which is an element will be described using FIG. 24(a). Diffusion layers 201 to serve as source/drain regions are formed on a surface of a semiconductor substrate 200. A gate insulating film 202, a polysilicon film 203a to serve as a gate electrode, and silicon nitride films 204a and 205a are successively laminated between the diffusion layers 201 on the semiconductor substrate 200.

A silicon nitride film 207a is formed so as to cover sidewall films 206a and the silicon nitride film 205a. A BPSG film 208a to serve as an interlayer insulating film and a silicon dioxide film 209a are formed so as to cover the silicon nitride film 207a. In addition, there are formed contact plugs 210 penetrating through the BPSG film 208a and the silicon dioxide film 209a and having contact with the diffusion layers 201.

As shown in FIG. 24(b), the dummy pattern in the active area is configured in the same way as the MOS transistor shown in FIG. 24A except the presence or absence of the diffusion layers and the contact plugs.

The configuration of the dummy pattern in the element-isolating region 211c will be described using FIG. 24(c). This dummy pattern has the silicon dioxide film 211c for forming the element-isolating region and a silicon nitride film 205c formed on the silicon dioxide film 211c. A silicon nitride film 207c is formed so as to cover sidewall films 206c and the silicon nitride film 205c.

A BPSG film 208c to serve as an interlayer insulating film and a silicon dioxide film 209c are formed so as to cover the silicon nitride film 207c.

The upper surfaces of the BPSG films 208a to 208c are almost flush with the upper surfaces of the silicon nitride films 207a to 207c on the silicon nitride films 205a to 205c. In addition, the upper surfaces of the silicon dioxide films 209a, 209b and 209c are almost flush with one another.

Assuming that a height from the surface of the semiconductor substrate 200 to the upper surface of the silicon dioxide film 209a is "Ha" and a height from the surface of the semiconductor substrate 200 to the upper surface of the silicon dioxide film 209c is "Hc", then $0.8 \times Ha \leq Hc \leq Ha$ is satisfied.

As described above, it is possible to suppress a degradation in an interlayer breakdown voltage in the element-isolating region by aligning the interlayer insulating films in height so as to be almost flush with one another both in the active area and in the element-isolating region. It is also possible to prevent a short-circuit in an upper interconnect layers formed on the interlayer insulating films, thereby making the semiconductor device highly reliable.

Now, an explanation will be made of a method for manufacturing such a semiconductor device as described above, using the cross-sectional process drawings shown in FIGS. 25 to 31. Suffixes (a) to (c) in the respective figures correspond to suffixes (a) to (c) in FIG. 24. That is, suffix (a) denotes a vertical cross-section in a region where a MOS transistor which is an element is formed, suffix (b) denotes a vertical cross-section in a region where a dummy pattern in an active area is formed, and suffix (c) denotes a vertical cross-section in a region where a dummy pattern in an element-isolating region is formed.

The formation of the gate insulating film 202, polysilicon film 203 and silicon nitride film 204 on the semiconductor substrate 200, the formation of a trench to be shaped into a desired element-isolating region pattern using a lithography technique, the formation of the silicon dioxide film 211 so as to fill the trench, and the planarization of the silicon dioxide film 211 using the silicon nitride film 204 as a stopper are the same as the steps shown in FIGS. 3 to 6 in the above-described first embodiment and, therefore, will neither be explained nor illustrated in further detail.

Figure 25:
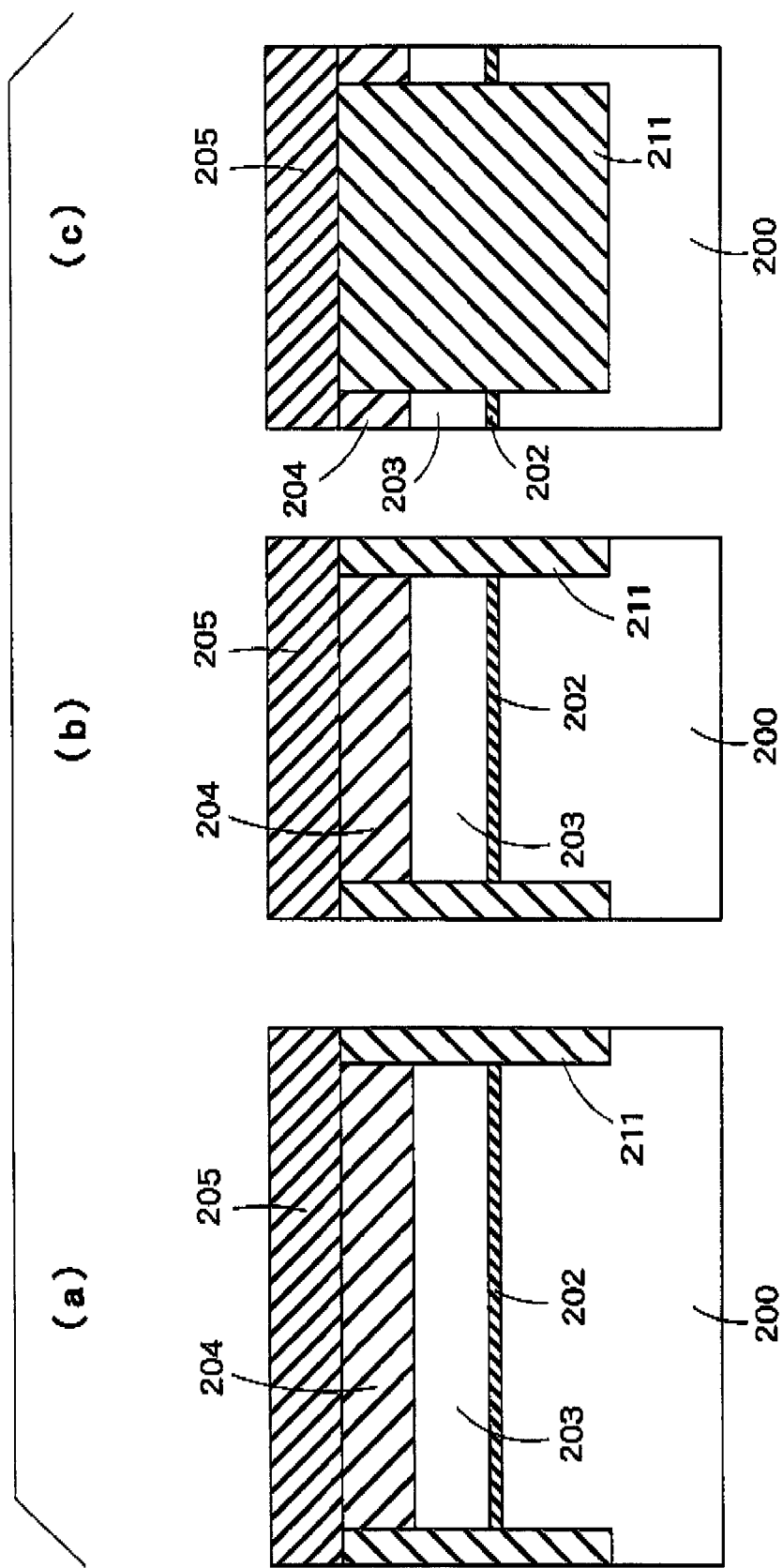
FIG. 25 is a sectional view illustrating one step of a method for manufacturing the semiconductor device according to the second embodiment.

As shown in FIG. 25, a 150 nm-thick silicon nitride film 205 is formed on the silicon nitride film 204 and the silicon dioxide films 211.

Figure 26:
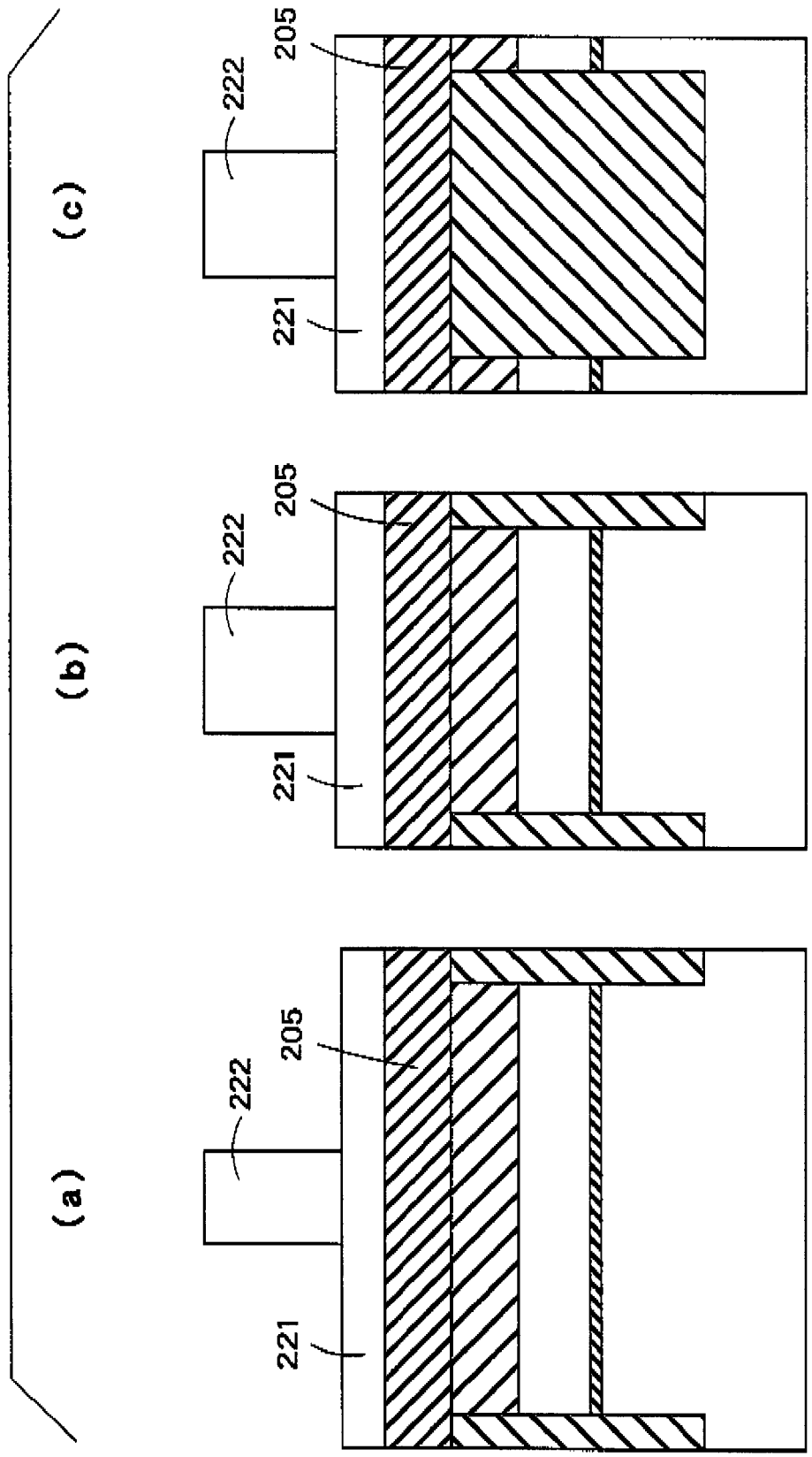
FIG. 26 is a sectional view showing a step of subsequent to FIG. 25.

As shown in FIG. 26, an antireflection film 221 is formed on the silicon nitride film 205. Using a lithography technique, a photoresist 222 is formed so as to shape into desired gate and dummy patterns.

Figure 27:
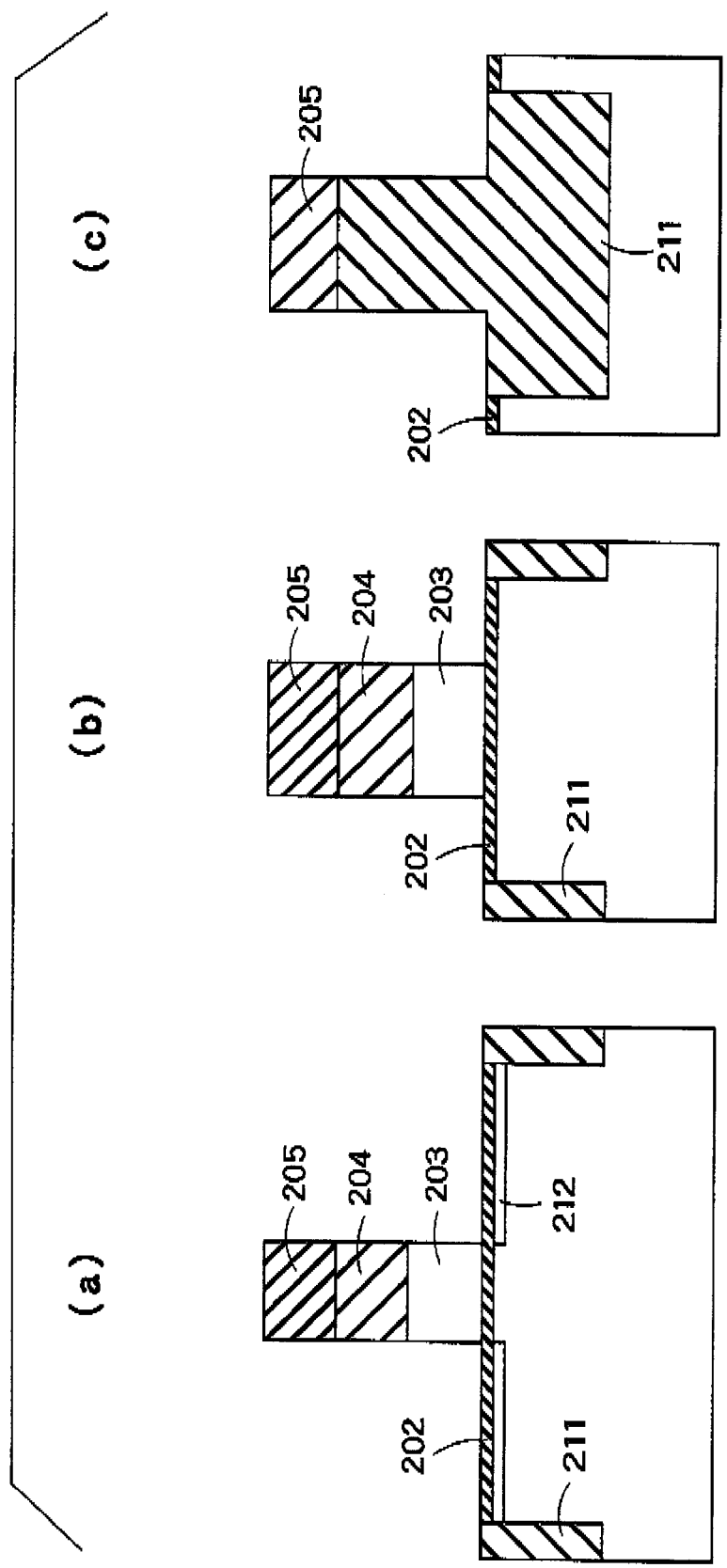
FIG. 27 is a sectional view showing a step of subsequent to FIG. 26.

As shown in FIG. 27, the antireflection film 221, the silicon nitride films 205 and 204, and the polysilicon film 203 are RIE-processed using the photoresist 222 as a mask.

If the thickness of the photoresist 222 is inadequate depending on the RIE conditions, the pattern in question may be temporarily transferred to the silicon nitride film 205 and the photoresist 222 may be removed. Then, the above-described processing may be performed using the silicon nitride film 205 as a mask. At this time, there is applied such processing as to reduce the height of the silicon dioxide film 211 to the position of the gate insulating film 202.

Subsequently, the photoresist 222 and the antireflection film 221 are removed using an ashing technique or the like.

After this, as shown in FIG. 27(a), shallow diffusion layer regions 212 are formed on the surface of the semiconductor substrate 100.

Figure 28:
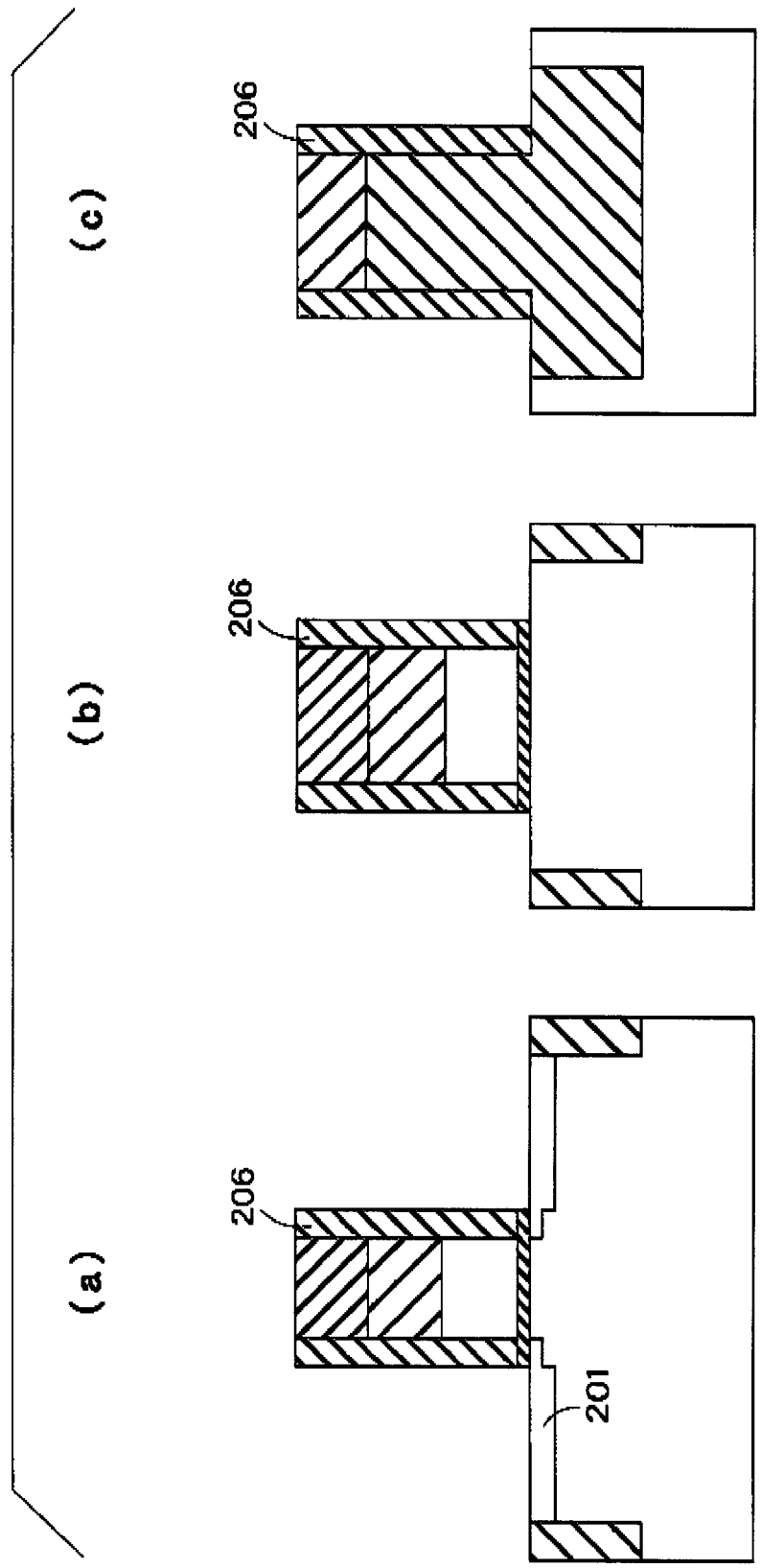
FIG. 28 is a sectional view showing a step of subsequent to FIG. 27.

As shown in FIG. 28, diffusion layers 201 to serve as source/drain regions are formed using in combination a lithography technique, an ion implantation technique, an RTA technique and the like. In order to construct an LDD (Lightly Doped Drain) structure, sidewall films 206 are formed using in combination an LP-CVD (low-pressure CVD) technique and an RIE technique. The sidewall films 206 are, for example, silicon dioxide films.

Figure 29:
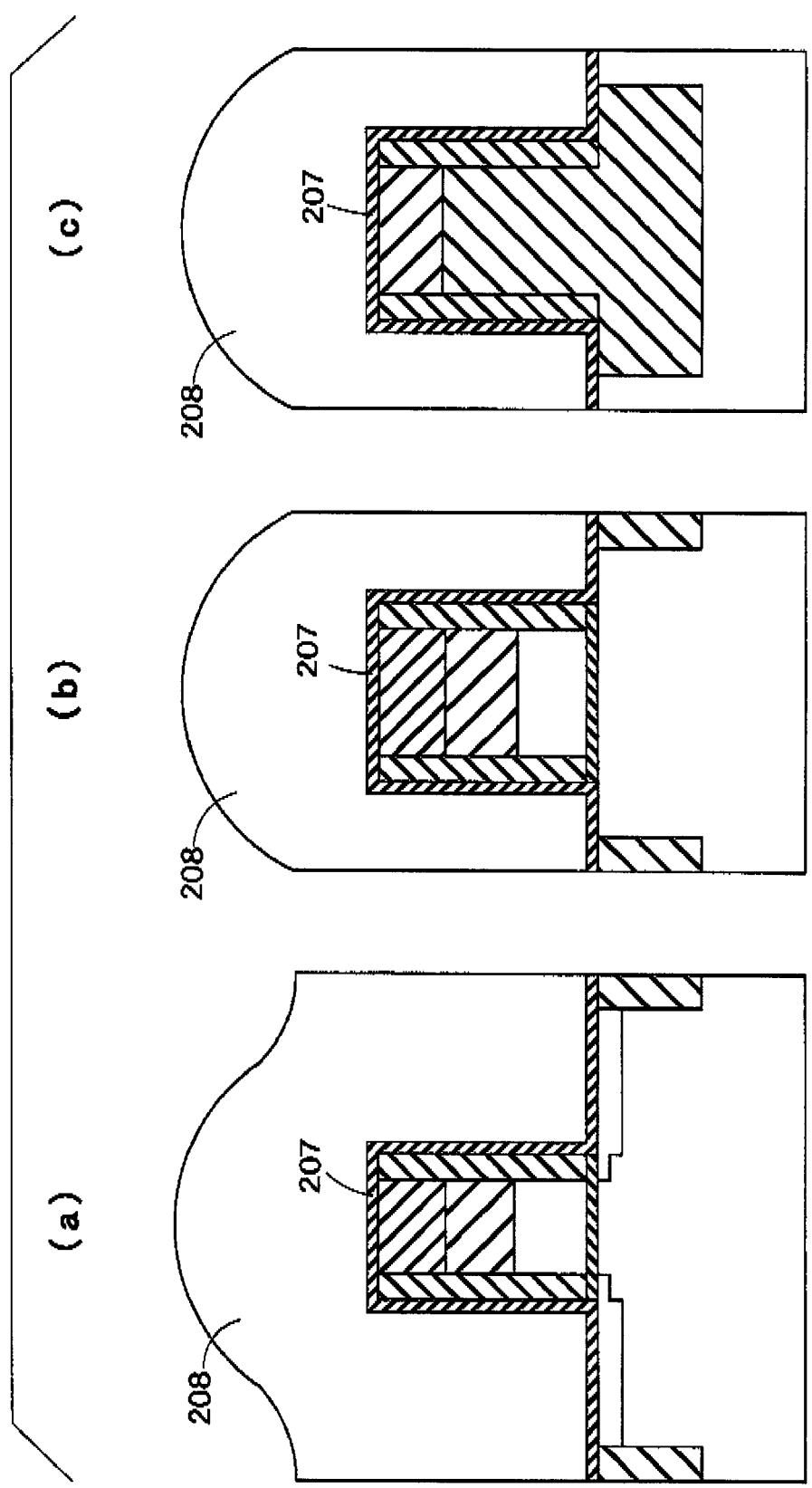
FIG. 29 is a sectional view showing a step of subsequent to FIG. 28.

As shown in FIG. 29, a 20 nm-thick silicon nitride film 207 is formed so as to cover the gate and dummy patterns. Then, a BPSG film 208 for composing an interlayer insulating film is formed and subjected to reflow by heat treatment.

Figure 30:
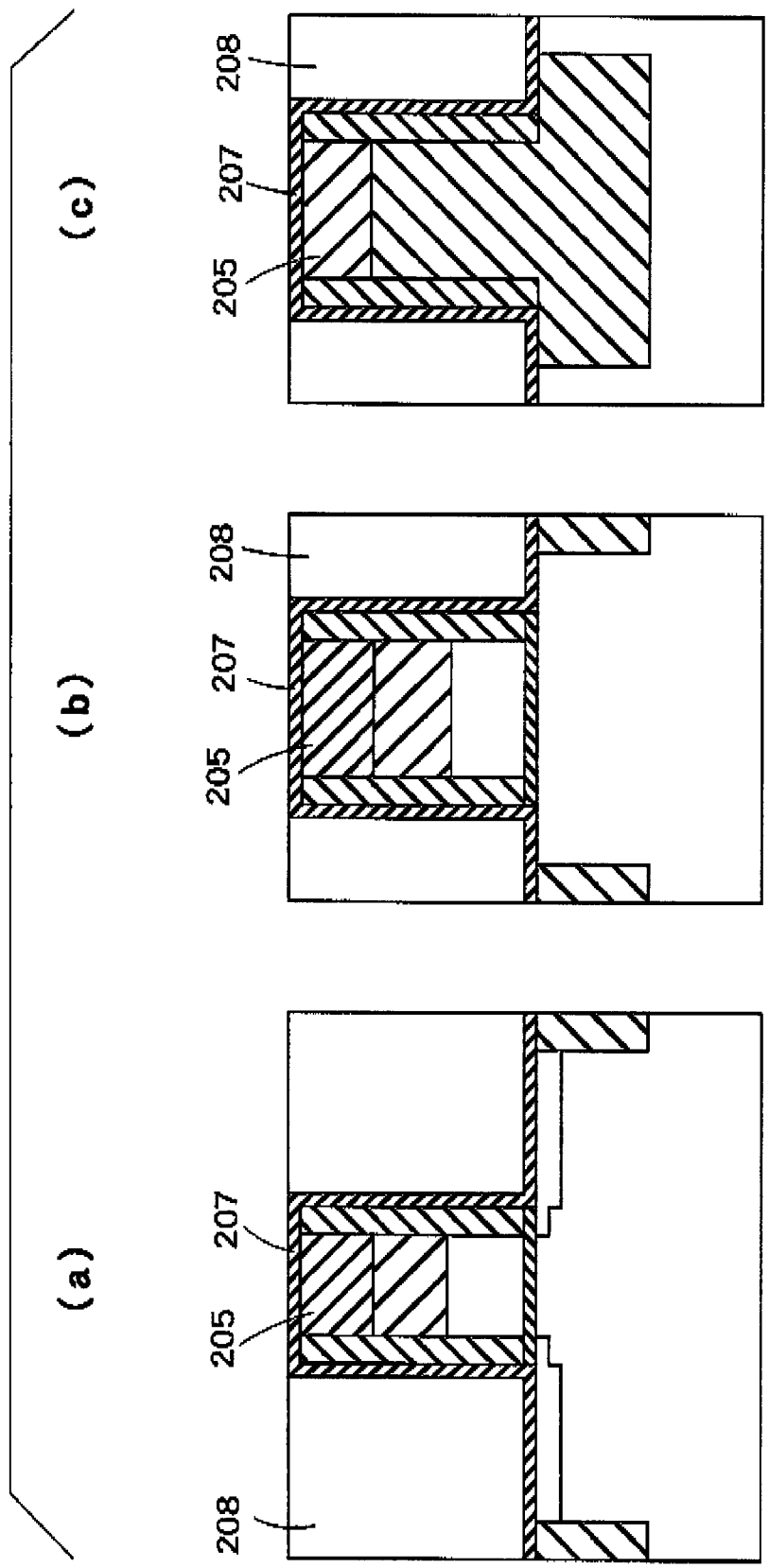
FIG. 30 is a sectional view showing a step of subsequent to FIG. 29.

As shown in FIG. 30, the BPSG film 208 is planarized using a CMP technique. The silicon nitride films 207 and 205 serve as stoppers. Consequently, it is possible to make the BPSG film almost uniform in height both in the active area and in the element-isolating region.

Figure 31:
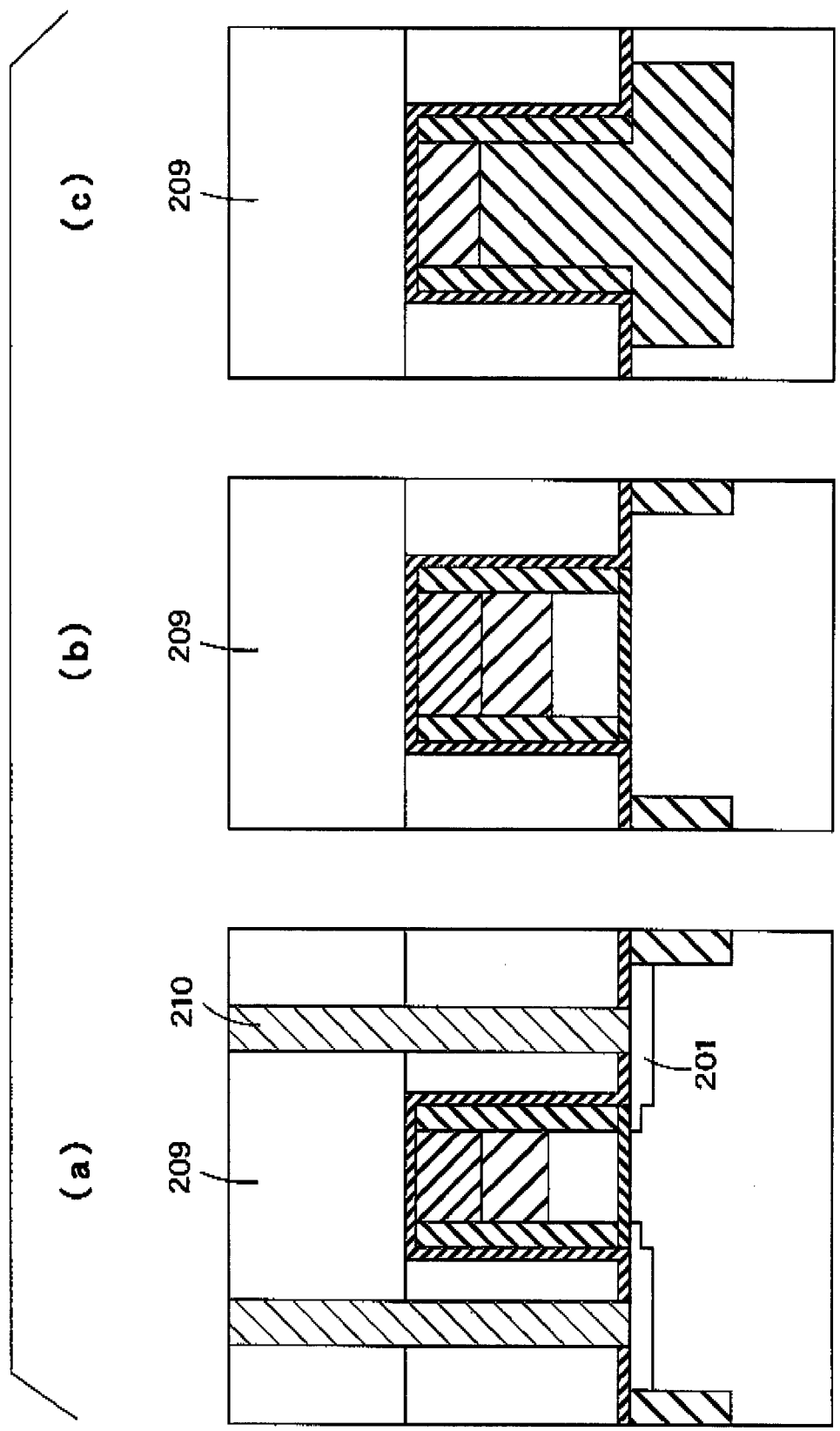
FIG. 31 is a sectional view showing a step of subsequent to FIG. 30.

As shown in FIG. 31, a silicon dioxide film 209 for composing an interlayer insulating film is formed. Then, there are made contact holes penetrating through the silicon dioxide film 209 and the BPSG film 208 and exposing the upper surfaces of the diffusion layers 201, and contact plugs 210 are formed in the holes.

Since the BPSG film is made almost uniform in height in the step shown in FIG. 30, it is possible to suppress a variation in the height of the interlayer insulating film both in the active area and in the element-isolating region, and make the upper surface of the interlayer insulating film almost planar. Accordingly, it is possible to make the upper surface of the interlayer insulating film almost planar, thereby preventing a short-circuit in an upper interconnect layer formed on the interlayer insulating film.

In addition, it is possible to prevent such a problem as a failure to make contact holes. Furthermore, it is possible to prevent a degradation in an interlayer breakdown voltage in the element-isolating region, thereby enabling the manufacture of a highly-reliable semiconductor device.

Third Embodiment

Figure 32:
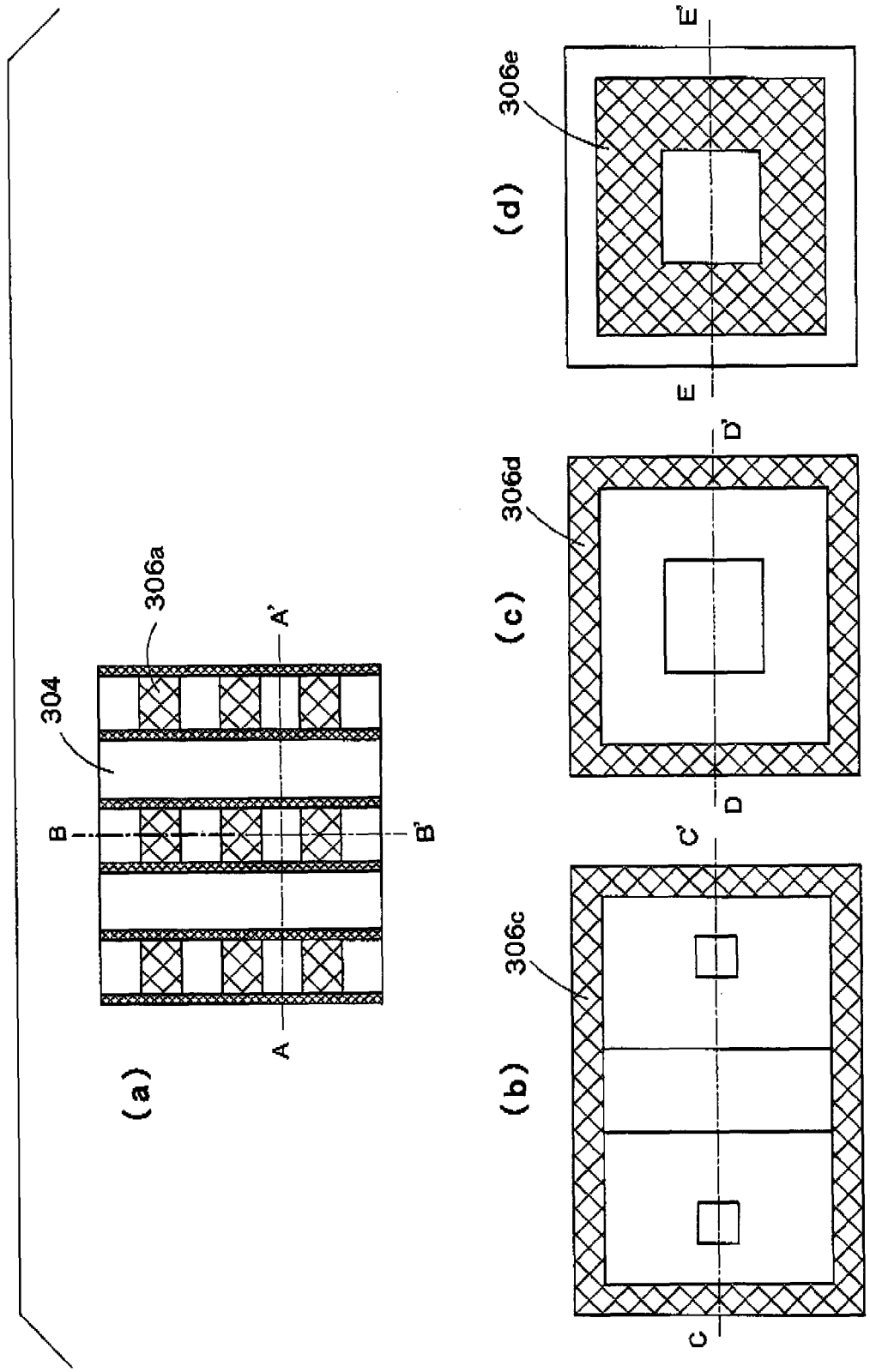
FIG. 32 is a plan view of a semiconductor memory device according to a third embodiment of the present invention.

FIG. 32 shows a plan view of a semiconductor memory device according to a third embodiment of the present invention. FIG. 32(a) shows a memory element within a memory cell array region, FIG. 32(b) shows a MOS transistor which is an element within a peripheral circuit region, FIG. 32(c) shows a dummy pattern in the active area of the peripheral circuit region, and FIG. 32(d) shows a dummy pattern in the element-isolating region of the peripheral circuit region.

FIG. 33(a) shows a vertical cross-section as viewed along the line A-A' in FIG. 32(a), FIG. 33(b) shows a vertical cross-section as viewed along the line B-B' in FIG. 32(a), FIG. 33(c) shows a vertical cross-section as viewed along the line C-C' in FIG. 32(b), FIG. 33(d) shows a vertical cross-section as viewed along the line D-D' in FIG. 32(c), and FIG. 33(e) shows a vertical cross-section as viewed along the line E-E' in FIG. 32(d).

Now, the structure of the memory element will be explained using FIGS. 33(a) and 33(b). A tunnel-insulating film 301a is formed on a semiconductor substrate 300, and floating gate electrodes 302a are formed at predetermined spacings on the tunnel-insulating film 301a.

Control gate electrodes 304 are formed on both sides of each floating gate electrode 302a through inter-poly insulating films 303. Diffusion layers 305 to serve as source/drain regions are formed on a surface of the semiconductor substrate 300 below the control gate electrodes 304.

The control gate electrodes 304 are formed in a belt-like manner along a vertical direction (hereinafter referred to as the first direction) in FIG. 32(a). In addition, element-isolating insulating films 306a are formed in a belt-like manner along a second direction orthogonal to the first direction.

A silicon nitride film 307 is formed on the element-isolating insulating films 306a and the floating gate electrodes 302a in a belt-like manner along the first direction. A silicon dioxide film 308a to serve as an interlayer insulating film is formed on the silicon nitride film 307 and the control gate electrodes 304.

The silicon nitride film 307 is composed of two layers, i.e., silicon nitride films 310a and 312a.

Now, the configuration of the MOS transistor which is an element in the peripheral circuit region will be explained using FIG. 33(c). Diffusion layers 309 to serve as source/drain regions are formed on a surface of the semiconductor substrate 300. A gate insulating film 301c, a gate electrode 302c, and a silicon nitride film 310c are successively laminated between the diffusion layers 309 on the semiconductor substrate 300.

A silicon nitride film 312c is formed so as to cover sidewall films 311c and the silicon nitride film 310c. A BPSG film 313c to serve as an interlayer insulating film and a silicon dioxide film 308c are formed so as to cover the silicon nitride film 312c. In addition, there is formed contact plugs 314 penetrating through the BPSG film 313c and the silicon dioxide film 308c and having contact with the diffusion layers 309.

As shown in FIG. 33(d), the dummy pattern in the active area of the peripheral circuit region is configured in the same way as the MOS transistor shown in FIG. 33(c) except the presence or absence of the diffusion layers and the contact plugs.

Now, the configuration of the dummy pattern in the element-isolating region will be explained using FIG. 33(e). This dummy pattern has an element-isolating insulating film 306e and a silicon nitride film 310e formed thereon. A silicon nitride film 312e is formed so as to cover the sidewall films 311e and the silicon nitride film 310e.

A BPSG film 313e to serve as an interlayer insulating film and a silicon dioxide film 308e are formed so as to cover the silicon nitride film 312e.

The upper surfaces of the BPSG films 313c to 313e and the upper surfaces of the silicon nitride films 312c to 312e on the silicon nitride films 310c to 310e are almost flush with one another. The total thickness of each pair of the silicon nitride films 310c and 312c, 310d and 312d, and 310e and 312e is almost equal to the thickness of the silicon nitride film 307.

In addition, the upper surfaces of the silicon dioxide films 308a, 308c, 308d and 308e are almost flush with one another. Assuming that a height from the surface of the semiconductor substrate 300 to the upper surface of the silicon dioxide film 308c is "H1" and a height from the surface of the semiconductor substrate 300 to the silicon dioxide film 308e is "H2", then 0.8×H1 ≦H2 is satisfied.

As described above, it is possible to suppress a degradation in an interlayer breakdown voltage in the dummy pattern of the element-isolating region by aligning the interlayer insulating films in height so as to be flush with one another both in the memory cell array region and in the peripheral circuit region. It is also possible to prevent a short-circuit in an upper interconnect layer formed on the interlayer insulating films, thereby making the semiconductor device highly reliable.

A method for manufacturing such a semiconductor memory device as described above will be explained using the cross-sectional process drawings shown in FIGS. 34 to 51. Suffixes (a) to (e) in the respective figures correspond to suffixes (a) to (e) in FIG. 33.

As shown in FIG. 34, desired well and channel regions (none of which are illustrated) are formed in a semiconductor substrate 300 using an ion implantation technique, and then an 8 nm-thick insulating film 301 is formed on the semiconductor substrate 300. The insulating film 301 is, for example, a silicon dioxide film.

Subsequently, an 80 nm-thick polysilicon film 302 and an 80 nm-thick silicon nitride film 320 are successively formed on the insulating film 301. The polysilicon film 302 is, for example, a polysilicon film doped with phosphorous as an impurity.

Then, a 50 nm-thick antireflection film 321 is formed on the silicon nitride film 320. Using a lithography technique, a 150 nm-thick photoresist 322 is formed so as to shape into a desired element-isolating region pattern.

As shown in FIG. 35, the antireflection film 321, the silicon nitride film 320, the polysilicon film 302, the insulating film 301 and the semiconductor substrate 300 are RIE-processed using the photoresist 322 as a mask to form a 250 nm-deep trench T.

Then, the photoresist 322 and the antireflection film 321 are removed using an ashing technique or the like.

As shown in FIG. 36, a 500 nm-thick silicon dioxide film 306 is formed using, for example, an HDP-CVD (High-Density Plasma CVD) technique, so as to fill the trench T.

As shown in FIG. 37, the silicon dioxide film 306 is planarized using a CMP technique with the silicon nitride film 320 used as a stopper.

As shown in FIG. 38, the silicon dioxide film 306 is RIE-processed so that the upper surface thereof is level with the upper surface of the polysilicon film 302. Wet etching may be used rather than RIE.

As shown in FIG. 39, the silicon nitride film 320 is removed using a wet etching technique or an RIE technique.

This removal of the silicon nitride film 320 and the height adjustment of the silicon dioxide film 306 shown in FIG. 38 may be performed continuously while changing over RIE etching steps. Alternatively, the removal and the height adjustment may be performed collectively under the condition in which the etching rates of the silicon dioxide film 306 and the silicon nitride film 320 are equalized.

As shown in FIG. 40, a 150 nm-thick silicon nitride film 310 is formed on the polysilicon film 302 and the silicon dioxide films 306.

As shown in FIG. 41, a 50 nm-thick antireflection film 323 is formed on the silicon nitride film 310. Using a lithography technique, a 150 nm-thick photoresist 324 is formed so as to shape into desired gate and dummy patterns.

As shown in FIG. 42, the antireflection film 323, the silicon nitride film 310, and the polysilicon film 302 are RIE-processed using the photoresist 324 as a mask.

If the thickness of the photoresist 324 is inadequate depending on the RIE conditions, the pattern in question may be temporarily transferred to the silicon nitride film 310 and the photoresist 324 may be removed. Then, the above-described processing may be performed using the silicon nitride film 310 as a mask. At this time, there is applied such processing as to reduce the height of the silicon dioxide film 306 to the position of the insulating film 301.

Subsequently, the photoresist 324 and the antireflection film 323 are removed using an ashing technique or the like.

After this, as shown in FIG. 42(c), shallow diffusion layer regions 315 are formed in a surface of the semiconductor substrate 300.

Figure 43:
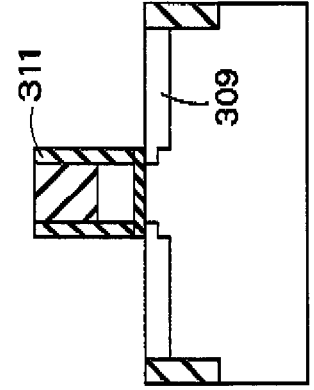
FIG. 43 is a sectional view showing a step of subsequent to FIG. 42.

As shown in FIG. 43, diffusion layers 309 to serve as source/drain regions are formed using in combination a lithography technique, an ion implantation technique, an RTA technique and the like. In order to construct an LDD (Lightly Doped Drain) structure, sidewall films 311 are formed using in combination an LP-CVD (Low-Pressure CVD) technique and an RIE technique. The sidewall films 311 are, for example, silicon dioxide films.

As shown in FIG. 44, a 20 nm-thick silicon nitride film 312 is formed so as to cover the gate and dummy patterns. Then, a 600 nm-thick BPSG film 313 for composing an interlayer insulating film is formed and subjected to reflow by heat treatment.

As shown in FIG. 45, the BPSG film 313 is planarized using a CMP technique. The silicon nitride films 312 and 310 serve as stoppers. Consequently, it is possible to make the BPSG film 313 almost uniform in height both in the memory cell array region and in the peripheral circuit region (active area and element-isolating region).

As shown in FIG. 46, a 50 nm-thick antireflection film 325 is formed. Using a lithography technique, a 150 nm-thick photoresist 326 is formed so as to shape into a desired gate array of a memory element.

As shown in FIG. 47, the antireflection film 325, the silicon nitride films 312 and 310, and the polysilicon film 302 are RIE-processed using the photoresist 326 as a mask.

If the thickness of the photoresist 326 is inadequate depending on the RIE conditions, the pattern in question may be temporarily transferred to the silicon nitride films 312 and 310 and the photoresist 326 may be removed. Then, the above-described processing may be performed using the silicon nitride films 312 and 310 as masks.

Subsequently, the photoresist 326 and the antireflection film 325 are removed using an ashing technique or the like.

As shown in FIG. 48, diffusion layers 305 are formed, and then an inter-poly insulating film 303 is formed. Then, a 100 nm-thick polysilicon film 304 doped with, for example, an appropriate amount of phosphorous as an impurity is formed.

The inter-poly insulating film 303 is, for example, an ONO film composed of a lamination of a silicon dioxide film and a silicon nitride film, each being 5 nm thick.

As shown in FIG. 49, the polysilicon film 304 is etched using an RIE technique to form control gate electrodes (word lines). At this time, a redundant portion of the inter-poly insulating film 303 is also removed as necessary.

As shown in FIG. 50, a 300 nm-thick silicon dioxide film 308 for composing an interlayer insulating film is formed.

As shown in FIG. 51, there are made contact holes penetrating through the silicon dioxide film 308 and the BPSG film 313 and exposing the upper surfaces of the diffusion layers 309, and contact plugs 314 are formed in the holes.

Since the BPSG film 313 is made almost uniform in height in the step shown in FIG. 45, it is possible to suppress a variation in the height of the interlayer insulating film in the memory cell array region, in the element region of a peripheral circuit (active area) and in the element-isolating region of the peripheral circuit, thereby making the upper surface of the interlayer insulating film almost planar. Accordingly, it is possible to prevent a short-circuit in an upper interconnect layer formed on the interlayer insulating film.

In addition, it is possible to prevent such a problem as a failure to make contact holes. Furthermore, it is possible to prevent a degradation in an interlayer breakdown voltage in the element-isolating region of the peripheral circuit, thereby enabling the manufacture of a highly-reliable semiconductor memory device.

The above-described method for manufacturing a semiconductor memory device is the result of applying a method for manufacturing a semiconductor device according to the first embodiment. Alternatively, a method for manufacturing a semiconductor device according to the second embodiment may be applied to the above-described method. In that case, three silicon nitride films 316a, 317a and 318a are formed on each floating gate electrode 302a, as shown in FIGS. 52(a) and 52(b).

In addition, as shown in FIG. 52(c), three silicon nitride films 316c, 317c and 318c are formed on the gate electrode 302c of the MOS transistor in the peripheral circuit region. Furthermore, as shown in FIG. 52(d), the dummy pattern in the active area of the peripheral circuit region is configured in the same way as the MOS transistor.

As shown in FIG. 52(e), there are formed two silicon nitride films in the dummy pattern in the element-isolating region, i.e., silicon nitride films 317e and 318e.

Even in such a configuration as described above, it is still possible to make the upper surface of the interlayer insulating film almost planar, thereby making the semiconductor memory device highly reliable.

What is claimed is:

1. A method for manufacturing a semiconductor device, comprising:
    forming a first insulating film on a semiconductor substrate;
    forming an electrode layer on said first insulating film;
    etching said electrode layer, said first insulating film, and said semiconductor substrate to form a trench in a first predetermined region of said device;
    burying an element-isolating insulating film in said trench;
    forming a second insulating film on said element-isolating insulating film and above said electrode layer;
    etching said second insulating film, said electrode layer, and said element-isolating insulating film to form a gate pattern comprising said second insulating film and said electrode layer in a second predetermined region of said device and to form a dummy pattern comprising said second insulating film and said element-isolating insulating film in a third predetermined region of said device;
    forming a third insulating film for covering said gate pattern and said dummy pattern; and
    planarizing said third insulating film using said second insulating film as a stopper.

2. The method for manufacturing a semiconductor device according to claim 1, wherein said element-isolating insulating film is buried in said trench so that the upper surface thereof is level with the upper surface of said electrode layer, and said second insulating film is formed on said element-isolating insulating film and on said electrode layer.

3. The method for manufacturing a semiconductor device according to claim 1, wherein said second insulating film is a silicon nitride film and said third insulating film is a BPSG film.

4. The method for manufacturing a semiconductor device according to claim 1, further including:
    forming a fourth insulating film on said electrode layer;
    etching said fourth insulating film, said electrode layer, said first insulating film and said semiconductor substrate of said first predetermined region to form said trench; and
    processing said element-isolating insulating film so that the upper surface thereof is level with the upper surface of said electrode layer and removing said fourth insulating film, prior to said forming said second insulating film.

5. The method for manufacturing a semiconductor device according to claim 4, wherein said processing said element-isolating insulating film and said removing said fourth insulating film are carried out simultaneously.

6. The method for manufacturing a semiconductor device according to claim 4, further including:
    forming a fifth insulating film for covering said gate pattern and said dummy pattern prior to said forming said third insulating film; and
    planarizing said third insulating film using said second insulating film and said fifth insulating film as stoppers.

7. The method for manufacturing a semiconductor device according to claim 6, wherein said second insulating film and said fifth insulating film are silicon nitride films and said third insulating film is a BPSG film.

8. The method for manufacturing a semiconductor device according to claim 1, further including:
    forming a fourth insulating film on said electrode layer;
    etching said fourth insulating film, said electrode layer, said first insulating film and said semiconductor substrate of said first predetermined region to form said trench; and
    forming said second insulating film on said element-isolating insulating film and on said fourth insulating film.

9. The method for manufacturing a semiconductor device according to claim 8, further including:
    forming a fifth insulating film for covering said gate pattern and said dummy pattern prior to said forming said third insulating film; and
    planarizing said third insulating film using said second insulating film and said fifth insulating film as stoppers.

10. The method for manufacturing a semiconductor device according to claim 9, wherein said second insulating film and said fifth insulating film are silicon nitride films and said third insulating film is a BPSG film.

11. A method for manufacturing a semiconductor memory device, comprising:
    forming a first insulating film on a semiconductor substrate;
    forming a first electrode layer on said first insulating film;
    etching said first electrode layer, said first insulating film, and said semiconductor substrate to form a first trench in a first predetermined region of said device;
    burying an element-isolating insulating film in said first trench;
    forming a second insulating film on said element-isolating insulating film and above said first electrode layer;
    etching said second insulating film, said first electrode layer, and said element-isolating insulating film to form a gate pattern comprising said second insulating film and said first electrode layer in a second predetermined region in a peripheral circuit region of said device and to form a dummy pattern comprising said second insulating film and said element-isolating insulating film in a third predetermined region in a peripheral circuit region of said device;
    forming a third insulating film for covering said gate pattern, said dummy pattern, and said second insulating film of a memory cell array region;
    planarizing said third insulating film using said second insulating film as a stopper;
    etching said second insulating film and said first electrode layer at predetermined spacings along a predetermined direction in said memory cell array region to form a second trench;
    forming a fourth insulating film to serve as an inter-poly insulating film on the bottom face and side surfaces of said second trench; and
    burying a second electrode layer in said second trench to form a word line.

12. The method for manufacturing a semiconductor memory device according to claim 11, wherein said element-isolating insulating film is buried in said first trench so that the upper surface thereof is level with the upper surface of said first electrode layer, and said second insulating film is formed on said element-isolating insulating film and on said first electrode layer.

13. The method for manufacturing a semiconductor memory device according to claim 11, further including:
    forming a fifth insulating film on said first electrode layer;

etching said fifth insulating film, said first electrode layer, said first insulating film and said semiconductor substrate of said first predetermined region to form said first trench; and processing said element-isolating insulating film so that the upper surface thereof is level with the upper surface of said first electrode layer and removing said fifth insulating film, prior to said forming said second insulating film.

14. The method for manufacturing a semiconductor memory device according to claim 13, further including:

forming a sixth insulating film for covering said gate pattern and said dummy pattern prior to said forming said third insulating film; and planarizing said third insulating film using said second insulating film and said sixth insulating film as stoppers.

15. The method for manufacturing a semiconductor device according to claim 14, wherein said second insulating film and said sixth insulating film are silicon nitride films and said third insulating film is a BPSG film.

16. The method for manufacturing a semiconductor memory device according to claim 11, further including:

forming a fifth insulating film on said first electrode layer;

etching said fifth insulating film, said first electrode layer, said first insulating film and said semiconductor substrate of said first predetermined region to form said first trench; and forming said second insulating film on said element-isolating insulating film and on said fifth insulating film.

* * * * *